United States Patent
Nakai et al.

(10) Patent No.: US 12,308,523 B2
(45) Date of Patent: May 20, 2025

(54) RADIO WAVE ABSORBING COMPOSITION AND RADIO WAVE ABSORBER

(71) Applicant: FUJIFILM Corporation, Tokyo (JP)

(72) Inventors: Yoshihiro Nakai, Minami-ashigara (JP); Hirokazu Hashimoto, Minami-ashigara (JP)

(73) Assignee: FUJIFILM Corporation, Tokyo (JP)

( * ) Notice: Subject to any disclaimer, the term of this patent is extended or adjusted under 35 U.S.C. 154(b) by 428 days.

(21) Appl. No.: 17/666,984

(22) Filed: Feb. 8, 2022

(65) Prior Publication Data

US 2022/0166147 A1    May 26, 2022

Related U.S. Application Data

(63) Continuation of application No. PCT/JP2020/029625, filed on Aug. 3, 2020.

(30) Foreign Application Priority Data

Aug. 9, 2019  (JP) .................. 2019-148186

(51) Int. Cl.
| | |
|---|---|
| *H01Q 17/00* | (2006.01) |
| *C01G 49/00* | (2006.01) |
| *C08K 9/06* | (2006.01) |
| *H05K 9/00* | (2006.01) |
| *C08K 3/22* | (2006.01) |
| *C08K 5/54* | (2006.01) |
| *C08L 23/00* | (2006.01) |
| *H01F 1/113* | (2006.01) |
| *H01F 1/37* | (2006.01) |

(52) U.S. Cl.
CPC ....... *H01Q 17/004* (2013.01); *C01G 49/0036* (2013.01); *C01G 49/009* (2013.01); *C08K 9/06* (2013.01); *H05K 9/0075* (2013.01); *H05K 9/0083* (2013.01)

(58) Field of Classification Search
CPC .... H01Q 17/004; H01Q 1/3283; H01Q 17/00; C01G 49/0036; C01G 49/009; C01G 49/0045; C08K 9/06; C08K 2003/2272; C08K 2201/01; C08K 3/22; C08K 5/54; H05K 9/0075; H05K 9/0083; H05K 9/0081; H01F 1/348; H01F 1/113; H01F 1/37; H01F 1/0315; H01F 1/34; C08L 23/00
USPC .......................................................... 342/1
See application file for complete search history.

(56) References Cited

U.S. PATENT DOCUMENTS

| | | |
|---|---|---|
| 2004/0054029 A1 | 3/2004 | Fujiki et al. |
| 2020/0227833 A1* | 7/2020 | Hiroi .............. C01G 49/00 |
| 2021/0194147 A1* | 6/2021 | Nagano .......... B32B 15/085 |

FOREIGN PATENT DOCUMENTS

| | | | |
|---|---|---|---|
| EP | 3 943 451 A1 | 1/2022 | |
| JP | 57-180206 A | 11/1982 | |
| JP | 11-354972 A | 12/1999 | |
| JP | 2002-280207 A | 9/2002 | |
| JP | 2007-250823 A | 9/2007 | |
| JP | 2010077198 A * | 4/2010 | |
| JP | 2010-260766 A | 11/2010 | |
| JP | 4674380 B2 * | 4/2011 | |
| JP | 2012-009797 A | 1/2012 | |
| JP | 2019-104954 A | 6/2019 | |
| WO | WO-2019131675 A1 * | 7/2019 | ......... C01G 49/0045 |

OTHER PUBLICATIONS

Office Action dated Mar. 21, 2023 from the Korean Intellectual Property Office in KR Application No. 10-2022-7004162.
International Preliminary Report on Patentability dated Feb. 8, 2022 with a Translation of the Written Opinion of the International Searching Authority in Application No. PCT/JP2020/029625.
Written Opinion dated Oct. 20, 2020 issued by the International Searching Authority in Application No. PCT/JP2020/029625.
International Search Report dated Oct. 20, 2020 issued by the International Searching Authority in Application No. PCT/JP2020/029625.
Extended European Search Report dated Sep. 30, 2022, issued in European Application No. 20852947.9.
Office Action dated Mar. 6, 2024 in Chinese Application No. 202080056515.7.
Office Action dated Sep. 25, 2023 in Korean Application No. 10-2022-7004162.
Office Action dated Feb. 14, 2023 from the Japanese Patent Office in JP Application No. 2021-539213.
Decision of Refusal dated Aug. 8, 2023 in Japanese Application No. 2021-539213.
Office Action dated Jul. 25, 2024 from The State Intellectual Property Office of P.R. of China in Chinese Application No. 202080056515.7.
Communication dated Jan. 13, 2025 in Chinese Application No. 202080056515.7.

\* cited by examiner

*Primary Examiner* — Vladimir Magloire
*Assistant Examiner* — Remash R Guyah
(74) *Attorney, Agent, or Firm* — Sughrue Mion, PLLC

(57) ABSTRACT

There is provided a radio wave absorbing composition containing a magnetic powder and a binder. There is also provided a radio wave absorber containing a magnetic powder and a binder. The magnetic powder is a powder of a substitution-type hexagonal ferrite subjected to surface treatment with a surface treatment agent, the surface treatment agent is a silicon-based compound, and the binder is an olefin-based resin.

8 Claims, No Drawings

RADIO WAVE ABSORBING COMPOSITION AND RADIO WAVE ABSORBER

CROSS-REFERENCE TO RELATED APPLICATIONS

This application is a Continuation of PCT International Application No. PCT/JP2020/029625 filed on Aug. 3, 2020, which claims priority under 35 U.S.C. § 119(a) to Japanese Patent Application No. 2019-148186 filed on Aug. 9, 2019. Each of the above applications is hereby expressly incorporated by reference, in its entirety, into the present application.

BACKGROUND OF THE INVENTION

1. Field of the Invention

The present invention relates to a radio wave absorbing composition and a radio wave absorber.

2. Description of the Related Art

A radio wave absorber containing a magnetic powder as the radio wave absorbing material is known. In addition, examples of the radio wave absorber containing a magnetic powder include a radio wave absorber in which a magnetic powder is mixed with a binder (see JP2002-280207A, JP2010-260766A, and JP2012-9797A).

SUMMARY OF THE INVENTION

In recent years, as an electronic device that uses radio waves, a radar for recognizing an object by transmitting and receiving radio waves has attracted attention. For example, an on-vehicle radar transmits radio waves and receives the radio waves reflected by an object (such as a pedestrian, a vehicle, or the like), whereby it can recognize the presence of the object, the distance to the object, or the like. In order to prevent collision with an object, as necessary, an automatic driving control system of an automobile can be automatically brake and stop the automobile or can be automatically control the speed to keep the distance to the object based on the results obtained by the radar being recognizing the object.

In order to improve the reliability of the system that carries out various controls based on the results obtained by the radar being recognizing the object as described above, it is desired to improve the performance of the radar. For this reason, in recent years, it has begun to be examined to install a radio wave absorber on the front side (an incident side of the radio wave incident from the outside) of the radio wave transmitting and receiving unit of the radar to improve the recognition accuracy. The radio wave absorber is required to have excellent radio wave absorption performance in order to improve the recognition accuracy. Further, it is desirable that the radio wave absorber has excellent weather fastness from the viewpoint of suppressing the deterioration of an article in which the radio wave absorber is incorporated.

Further, a radio wave absorber having an excellent vibration damping property is desirable since it can also function as a vibration damping material in an article in which the radio wave absorber is incorporated.

In consideration of the above, one aspect of the present invention is to provide a radio wave absorber excellent in radio wave absorption performance, weather fastness, and vibration damping property.

As a result of diligent examinations for achieving the above object, the inventors of the present invention have newly found that in a case where a powder of a substitution-type hexagonal ferrite subjected to surface treatment with a silicon-based compound and an olefin-based resin are used in combination as a combination of a magnetic powder and a binder, it is possible to obtain a radio wave absorber excellent in radio wave absorption performance, weather fastness, and vibration damping property.

That is, one aspect of the present invention relates to;
a radio wave absorbing composition comprising a magnetic powder and a binder,
in which the magnetic powder is a powder of a substitution-type hexagonal ferrite subjected to surface treatment with a surface treatment agent,
the surface treatment agent is a silicon-based compound, and
the binder is an olefin-based resin.

In addition, one aspect of the present invention relates to;
a radio wave absorber comprising a magnetic powder and a binder,
in which the magnetic powder is a powder of a substitution-type hexagonal ferrite subjected to surface treatment with a surface treatment agent,
the surface treatment agent is a silicon-based compound, and
the binder is an olefin-based resin.

In one form, the radio wave absorber can be a molded product formed by molding the radio wave absorbing composition.

In one form, the substitution-type hexagonal ferrite can have a constitution represented by General Formula 1.

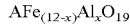
$$AFe_{(12-x)}Al_xO_{19} \qquad \text{General Formula 1:}$$

In General Formula 1, A represents one or more kinds of atoms selected from the group consisting of Sr, Ba, Ca, and Pb, and x satisfies 1.50≤x≤8.00.

In one form, the substitution-type hexagonal ferrite can be a substitution-type hexagonal strontium ferrite.

In one form, the surface treatment agent can be a silicon-based compound represented by General Formula 2.

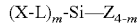
$$(X\text{-}L)_m\text{-Si}\text{---}Z_{4-m} \qquad \text{General Formula 2:}$$

In General Formula 2;
X is a hydrogen atom, an alkyl group, an alkenyl group, an aryl group, an alicyclic group, a heterocyclic group, a hydroxy group, an acrylamide group, a sulfanyl group, an isocyanate group, a thiocyanate group, a ureido group, a cyano group, an acid anhydride group, and an azide group, a carboxy group, an acyl group, a thiocarbamoyl group, a phosphate group, a phosphanyl group, a sulfonic acid group, or a sulfamoyl group,
L represents one divalent group or one bond, selected from the group consisting of a single bond, an alkylene group, an alkenylene group, an alkynylene group, an arylene group, —O—, —S—, —NR$^a$—, an ester bond, a thioester bond, an amide bond, a thioamide bond, and a sulfonyl group, or a divalent group or a bond, obtained by combining two or more of these,
R$^a$ represents a hydrogen atom or a substituent,
Z represents a hydroxy group, an alkoxy group, or an alkyl group, and
m is an integer in a range of 1 to 3.
In one form, in General Formula 2, m can be 1, and X can represent an alkenyl group or a heterocyclic group, or m can be 2 or 3, and a plurality of X's included in General Formula 2 can each independently represent an alkenyl group or a heterocyclic group.

In one form, in General Formula 2, m can be 1, and X can represent an acyl group, an acrylamide group, or a heterocyclic group, or m can be 2 or 3, and a plurality of X's included in General Formula 2 can each independently represent an acyl group, an acrylamide group, or a heterocyclic group, where the acyl group can be a (meth)acryloyl group, and the heterocyclic group can be an epoxy group.

In one form, in General Formula 2, X can represent an epoxy group.

In one form, in General Formula 2, L can include an alkylene group having 4 to 12 carbon atoms.

In one form, the olefin-based resin can be one or more resins selected from the group consisting of polyethylene, polypropylene, polymethylpentene, an ethylene-vinyl acetate resin, a cycloolefin resin, and an olefin-based resin containing a maleic acid anhydride unit.

In one form, the olefin-based resin can be one or more resins selected from the group consisting of polymethylpentene, a cycloolefin resin, and an olefin-based resin containing a maleic acid anhydride unit.

According to one aspect of the present invention, it is possible to provide a radio wave absorber excellent in radio wave absorption performance, weather fastness, and vibration damping property, and a radio wave absorbing composition that can be used for manufacturing the radio wave absorber.

DESCRIPTION OF THE PREFERRED EMBODIMENTS

[Radio Wave Absorbing Composition and Radio Wave Absorber]

One embodiment of the present invention relates to a radio wave absorbing composition containing a magnetic powder and a binder. In the radio wave absorbing composition, the magnetic powder is a powder of a substitution-type hexagonal ferrite subjected to surface treatment with a surface treatment agent, the surface treatment agent is a silicon-based compound, and the binder is an olefin-based resin.

In addition, one embodiment of the present invention relates to a radio wave absorber containing a magnetic powder and a binder. In the radio wave absorber, the magnetic powder is a powder of a substitution-type hexagonal ferrite subjected to surface treatment with a surface treatment agent, the surface treatment agent is a silicon-based compound, and the binder is an olefin-based resin.

In the present invention and the present specification, the "radio wave" shall refer to an electromagnetic wave having a frequency of 3 terahertz (THz) or less. The radio wave absorber and the composition that is used in the manufacture of the radio wave absorber have radio wave absorbability. The radio wave absorbability can be evaluated, for example, by the transmission attenuation amount and/or the reflection attenuation amount. It can be said that the higher the value of the transmission attenuation amount, the higher the value of the reflection attenuation amount, or the higher the value of the transmission attenuation amount and the value of the reflection attenuation amount, the more excellent the radio wave absorbability.

In the present invention and the present specification, the "powder" means an aggregation of a plurality of particles. The "aggregation" is not limited to an aspect in which particles that constitute an aggregation are in direct contact with each other, and also includes an aspect in which a binder or the like is interposed between the particles.

Hereinafter, the radio wave absorbing composition and the radio wave absorber will be described in more detail.

<Magnetic Powder>

The radio wave absorbing composition and the radio wave absorber include, as a magnetic powder, a powder of a substitution-type hexagonal ferrite subjected to surface treatment with a surface treatment agent. The powder of the substitution-type hexagonal ferrite subjected to surface treatment with a surface treatment agent can also be said to be a powder of the substitution-type hexagonal ferrite coated with a surface treatment agent. In the powder of the substitution-type hexagonal ferrite subjected to surface treatment with a surface treatment agent, at least a part of the surface of at least a part of particles that constitute the powder is coated with a surface treatment agent. The fact that a radio wave absorber contains a magnetic powder subjected to surface treatment with a surface treatment agent can be confirmed, for example, by analyzing a section sample cut out from the radio wave absorber by a known method. Alternatively, it can be confirmed by collecting a magnetic powder from a radio wave absorber or a radio wave absorbing composition by a known method and analyzing the collected magnetic powder by a known method such as mass spectrometry or gas chromatography.

(Powder of Substitution-Type Hexagonal Ferrite)

The above magnetic powder is a powder of a substitution-type hexagonal ferrite subjected to surface treatment with a surface treatment agent. In the present invention and the present specification, the "powder of a hexagonal ferrite" shall refer to a magnetic powder in which a hexagonal ferrite-type crystal structure is detected as the main phase by X-ray diffraction analysis. The main phase refers to a structure to which the highest intensity diffraction peak attributes in the X-ray diffraction spectrum obtained by X-ray diffraction analysis. For example, in a case where the highest intensity diffraction peak in the X-ray diffraction spectrum obtained by X-ray diffraction analysis attributes to the hexagonal ferrite-type crystal structure, it shall be determined that the hexagonal ferrite-type crystal structure is detected as the main phase. In a case where only a single structure is detected by X-ray diffraction analysis, this detected structure is used as the main phase. The hexagonal ferrite-type crystal structure contains at least an iron atom, a divalent metal atom, and an oxygen atom as constituent atoms. In the unsubstitution-type hexagonal ferrite, the atoms that constitute the crystal structure of the hexagonal ferrite are only the iron atom, the divalent metal atom, and the oxygen atom. On the other hand, the substitution-type hexagonal ferrite contains one or more kinds of other atoms together with the iron atom, the divalent metal atom, and the oxygen atom, as atoms that constitute the crystal structure of the hexagonal ferrite. These one or more kinds of other atoms are generally atoms that are substituted for a part of iron in the crystal structure of hexagonal ferrite. The divalent metal atom is a metal atom that is capable of being a divalent cation, as an ion, and examples thereof include an alkaline earth metal atom such as a strontium atom, a barium atom, or a calcium atom, and a lead atom. In the present invention and the present specification, the "hexagonal strontium ferrite powder" means one in which the main divalent metal atom contained in the crystal structure of the hexagonal ferrite is a strontium atom. The main divalent metal atom shall refer to a divalent metal atom that occupies the largest amount among the divalent metal atoms contained in the crystal structure of the hexagonal ferrite based on the % by atom. However, rare earth atoms shall not be included in the above divalent metal atoms. The "rare earth atom" in the present invention and the present specification is selected from the group consisting of a scandium atom (Sc), a yttrium atom (Y), and a lanthanoid atom. The lanthanoid atom is selected from the group consisting of a lanthanum atom (La), a cerium atom (Ce), a praseodymium atom (Pr), a neodymium atom (Nd), a promethium atom (Pm), a samarium atom (Sm), a europium atom (Eu), a gadolinium atom (Gd), a terbium atom (Tb), a dysprosium atom (Dy), a holmium atom (Ho), an erbium atom (Er), a thulium atom (Tm), a ytterbium atom (Yb), and a lutetium atom (Lu).

The substitution-type hexagonal ferrite contains one or more kinds of other atoms together with the iron atom, the divalent metal atom, and the oxygen atom, as atoms that constitute the crystal structure of the hexagonal ferrite. Examples of such atoms include one or more kinds of trivalent metal atoms selected from the group consisting of Al, Ga, and combinations of a divalent metal atom and a tetravalent metal atom, such as Mn and Ti, Co and Ti, and Zn and Ti. The substitution-type hexagonal ferrite can be preferably a substitution-type hexagonal strontium ferrite.

In one form, the magnetic powder can be a powder of a substitution-type hexagonal ferrite subjected to surface treatment with a surface treatment agent, the substitution type of which is a magnetoplumbite type (generally referred to as an "M type"). The magnetoplumbite-type hexagonal ferrite has a constitution represented by a constitution formula: $AFe_{12}O_{19}$ in a case where it does not contain an atom that is substituted for iron. Here, A can represent at least one kind of atom selected from the group consisting of Sr, Ba, Ca, and Pb, and also includes an aspect in which two or more of these atoms are contained in any ratio.

Examples of the hexagonal ferrite preferable from the viewpoint of radio wave absorption performance include a substitution-type magnetoplumbite-type hexagonal ferrite in which a part of iron atoms of the magnetoplumbite-type hexagonal ferrite is substituted with an aluminum atom. Examples of one embodiment of such hexagonal ferrite include the substitution-type hexagonal ferrite having a constitution represented by General Formula 1.

$$AFe_{(12-x)}Al_xO_{19} \qquad \text{General Formula 1:}$$

In General Formula 1, A represents one or more kinds of atoms (hereinafter, also referred to as an "A atom") selected from the group consisting of Sr, Ba, Ca, and Pb, it may be only one kind of atom, it may contain two or more kinds of atoms in any ratio, and, from the viewpoint of improving the uniformity of the constitution between particles that constitute the powder, it is preferably only one kind of atom.

From the viewpoint of radio wave absorption performance in the high frequency band, A in General Formula 1 is preferably one or more kinds of atoms selected from the group consisting of Sr, Ba, and Ca, and more preferably Sr.

In General Formula 1, x satisfies $1.50 \leq x \leq 8.00$. From the viewpoint of radio wave absorption performance in the high frequency band, x is 1.50 or more, more preferably more than 1.50, still more preferably 2.00 or more, and even still more preferably more than 2.00. In addition, from the viewpoint of magnetic properties, x is 8.00 or less, preferably less than 8.00, more preferably 6.00 or less, and still more preferably less than 6.00.

Specific examples of the substitution-type hexagonal ferrite represented by General Formula 1, the substitution type of which is a magnetoplumbite type, include $SrFe_{(9.58)}Al_{(2.42)}O_{19}$, $SrFe_{(9.37)}Al_{(2.63)}O_{19}$, $SrFe_{(9.27)}Al_{(2.73)}O_{19}$, $SrFe_{(9.85)}Al_{(2.15)}O_{19}$, $SrFe_{(10.00)}Al_{(2.00)}O_{19}$, 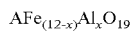$SrFe_{(9.74)}$ $Al_{(2.26)}O_{19}$, $SrFe_{(10.44)}Al_{(1.56)}O_{19}$, $SrFe_{(9.79)}Al_{(2.21)}O_{19}$, $SrFe_{(9.33)}Al_{(2.67)}O_{19}$, $SrFe_{(7.88)}Al_{(4.12)}O_{19}$, $SrFe_{(7.04)}Al_{(4.96)}O_{19}$, $SrFe_{(7.37)}Al_{(4.63)}O_{19}$, $SrFe_{(6.25)}Al_{(5.75)}O_{19}$, $SrFe_{(7.71)}Al_{(4.29)}O_{19}$, $Sr_{(0.80)}Ba_{(0.10)}Ca_{(0.10)}Fe_{(9.83)}Al_{(2.17)}O_{19}$, $BaFe_{(9.50)}Al_{(2.50)}O_{19}$, $CaFe_{(10.00)}Al_{(2.00)}O_{19}$, and $PbFe_{(9.00)}Al_{(3.00)}O_{19}$. In addition, specific examples thereof also include the substitution-type hexagonal strontium ferrite having a constitution shown in Table 1 described later. The constitution of hexagonal ferrite can be checked by high frequency inductively coupled plasma emission spectroscopy. Specific examples of the checking method include a method described in Examples described later. Alternatively, after exposing a cross-section by cutting the radio wave absorber or the like, the exposed cross-section is subjected to, for example, energy dispersive X-ray analysis, whereby the constitution of the magnetic powder contained in the radio wave absorber can be checked.

In one form, in the powder of the substitution-type hexagonal ferrite, the crystal phase can be a single crystal phase, and a plurality of crystal phases can be included. It is preferable that the crystal phase is a single phase, and it is more preferable that the powder of the hexagonal ferrite is a powder of a substitution-type hexagonal ferrite, the substitution type thereof being a magnetoplumbite type, in which the crystal phase is a single phase.

The case where the "crystal phase is a single phase" refers to a case where only one kind of diffraction pattern showing any crystal structure is observed in the X-ray diffraction analysis. The X-ray diffraction analysis can be carried out, for example, by the method described in Examples described later. In a case where a plurality of crystal phases are included, two or more kinds of diffraction patterns showing any crystal structure are observed in the X-ray diffraction analysis. Regarding the attribution of the diffraction pattern, for example, a database of the International Centre for Diffraction Data (ICDD, registered trade name) can be referenced. For example, regarding the diffraction pattern of the magnetoplumbite-type hexagonal ferrite containing Sr, "00-033-1340" of the International Centre for Diffraction Data (ICDD) can be referred to. However, in a case where a part of iron atoms are substituted with a substituent atom such as an aluminum atom, the peak position shifts from the peak position observed in a case where the substituent atom is not included.

(Method of Manufacturing Powder of Substitution-Type Hexagonal Ferrite)

Examples of the method of manufacturing a powder of a substitution-type hexagonal ferrite include a solid phase method and a liquid phase method. The solid phase method is a method of producing a powder of a hexagonal ferrite by sintering a mixture obtained by mixing a plurality of solid raw materials in a dry-type manner. On the other hand, the liquid phase method includes a step of using a solution. Hereinafter, one form of the method of manufacturing a powder of a substitution-type hexagonal ferrite by the liquid phase method will be described. However, the manufacturing method described below is an example, and the method of manufacturing the magnetic powder contained in the radio wave absorbing composition and the radio wave absorber is not limited to the following example.

One embodiment of the liquid phase method can include;
a step 1 of obtaining a precipitate from a solution containing an iron atom, at least one kind of atom selected from the group consisting of Sr, Ba, Ca, and Pb, and one or more substituent atoms that are substituted for an iron atom, and a step 2 of sintering the precipitate obtained in the step 1 to obtain a sintered product. Hereinafter, each of the steps will be described in detail.

Step 1

In the step 1, a hexagonal ferrite precursor can be obtained as a precipitate. For example, in order to obtain a powder of a hexagonal ferrite containing an aluminum atom as a substituent atom that is substituted for a part of iron atoms, an iron atom, an A atom, and an aluminum atom can be mixed in a solution. In this case, it is presumed that the precipitate obtained in the step 1 is iron hydroxide, aluminum hydroxide, a composite hydroxide of an iron atom, an aluminum atom, and an A atom.

The solution for obtaining the precipitate in the step 1 is preferably a solution containing at least water and is more preferably an aqueous solution. For example, a precipitate can be generated by mixing an aqueous solution containing various atoms (hereinafter, also referred to as a "raw material aqueous solution") with an alkaline aqueous solution. In addition, the step 1 can include a step of carrying out the solid-liquid separation of the precipitate.

The raw material aqueous solution can be, for example, an aqueous solution containing an Fe salt, an Al salt, and a salt of an A atom. These salts can be, for example, water-soluble inorganic acid salts such as nitrates, sulfates, and chlorides.

Specific examples of the Fe salt include iron (III) chloride hexahydrate [$FeCl_3 \cdot 6H_2O$] and iron (III) nitrate nonahydrate [$Fe(NO_3)_3 \cdot 9H_2O$].

Specific examples of the Al salts include aluminum chloride hexahydrate [$AlCl_3 \cdot 6H_2O$] and aluminum nitrate nonahydrate [$Al(NO_3)_3 \cdot 9H_2O$].

The salt of the A atom can be one or more kinds of salts selected from the group consisting of a Sr salt, a Ba salt, a Ca salt, and a Pb salt.

Specific examples of the Sr salt include strontium chloride hexahydrate [$SrCl_2 \cdot 6H_2O$], strontium nitrate [$Sr(NO_3)_2$], and strontium acetate 0.5 hydrate [$Sr(CH_3COO)_2 \cdot 0.5H_2O$].

Specific examples of the Ba salt include barium chloride dihydrate [$BaCl_2 \cdot 2H_2O$], barium nitrate [$Ba(NO_3)_2$], and barium acetate [$(CH_3COO)_2Ba$].

Specific examples of the Ca salt include calcium chloride dihydrate [$CaCl_2 \cdot 2H_2O$], calcium nitrate tetrahydrate [$Ca(NO_3)_2 \cdot 4H_2O$], and calcium acetate monohydrate [$(CH_3COO)_2Ca \cdot H_2O$].

Specific examples of the Pb salt include lead (II) chloride [$PbCl_2$] and lead (II) nitrate [$Pb(NO_3)_2$].

However, the above is an example, and other salts can be also used. The mixing ratio between various salts for preparing the raw material aqueous solution may be determined depending on the desired hexagonal ferrite constitution.

Examples of the alkaline aqueous solution include a sodium hydroxide aqueous solution and a potassium hydroxide aqueous solution. The concentration of the alkaline aqueous solution can be, for example, 0.1 mol/L to 10 mol/L. However, the kind and the concentration of the alkaline aqueous solution are not limited to the above examples as long as the precipitate can be produced.

The raw material aqueous solution and the alkaline aqueous solution may be simply mixed. The whole amount of the raw material aqueous solution and the whole amount of the alkaline aqueous solution may be mixed at one time, or the raw material aqueous solution and the alkaline aqueous solution may be gradually mixed. Alternatively, the mixing may be carried out by mixing while gradually adding one of the raw material aqueous solution and the alkaline aqueous solution to the other. The method of mixing the raw material aqueous solution with the alkaline aqueous solution is not particularly limited, and examples thereof include a method of mixing with stirring. A stirring unit is not particularly limited either, and a general stirring unit can be used. The stirring time may be set to a time during which a precipitate can be formed, and it can be appropriately set depending on the constitution of the raw material aqueous solution, the kind of the stirring unit to be used.

The temperature (the solution temperature) at which the raw material aqueous solution is mixed with the alkaline aqueous solution is, for example, preferably 100° C. or lower from the viewpoint of preventing explosive boil, and more preferably 95° C. or lower and still more preferably 15° C. or higher and 92° C. or lower from the viewpoint of causing the precipitation reaction to proceed well. As a unit for adjusting the temperature, a general heating device, cooling device, or the like can be used. The pH of the aqueous solution obtained by mixing the raw material aqueous solution with the alkaline aqueous solution, at a temperature of 25° C., is, for example, preferably in a range of 5 to 13 and more preferably in a range of 6 to 12 from the viewpoint that a precipitate is more easily obtained. The content of the substituent atom can be controlled by adjusting the pH.

In a case where the obtained precipitate is subjected to solid-liquid separation after the precipitate is formed, the method of thereof is not particularly limited, and examples thereof include decantation, centrifugation, and filtration (suction filtration, pressure filtration, or the like). For example, in a case where the solid-liquid separation is carried out by centrifugation, the conditions for centrifugation are not particularly limited, and for example, centrifugation can be carried out for 3 to 30 minutes at a rotation speed of 2,000 revolutions per minute (rpm) or more. Further, the centrifugation may be carried out a plurality of times.

Step 2

The step 2 is a step of sintering the precipitate obtained in the step 1.

In the step 2, the precursor of hexagonal ferrite can be converted to hexagonal ferrite by sintering the precipitate obtained in the step 1. The sintering can be carried out using a heating device. The heating device is not particularly limited, and a known heating device such as an electric furnace, a sintering device produced according to a production line, or the like can be used. The sintering can be carried out, for example, in an ambient air atmosphere. The sintering temperature and the sintering time may be set within a range in which the precursor of hexagonal ferrite can be converted to hexagonal ferrite. The sintering temperature is, for example, preferably 900° C. or higher, more preferably in a range of 900° C. to 1,400° C., and still more preferably in a range of 1,000° C. to 1,200° C. The sintering time is, for example, preferably in a range of 1 hour to 10 hours and more preferably in a range of 2 hours to 6 hours. In addition, the precipitate obtained in the step 1 can be dried before sintering. The drying unit is not particularly limited, and examples thereof include a dryer such as an oven. The drying temperature is, for example, preferably in a range of 50° C. to 200° C. and more preferably in a range of 70° C. to 150° C. The drying time is, for example, preferably in a range of 2 hours to 50 hours and more preferably in a range of 5 hours to 30 hours. The above sintering temperature and drying temperature can be the internal ambient temperature of the device for sintering or drying.

The sintered product obtained in the above step 2 can be an aggregated sintered product or a powder-shaped sintered product, in which the precursor of hexagonal ferrite is converted to show the crystal structure of hexagonal ferrite. Further, a step of pulverizing the sintered product can also be carried out. The pulverization can be carried out with a known pulverizing unit such as a mortar and pestle or a pulverizer (a cutter mill, a ball mill, a bead mill, a roller mill, a jet mill, a hammer mill, an attritor, or the like). For example, in the case of pulverizing using a medium, a particle size of the medium (a so-called medium diameter) is, for example, preferably in a range of 0.1 mm to 5.0 mm and more preferably in a range of 0.5 mm to 3.0 mm. The "medium diameter" in a case of a spherical medium means an arithmetic mean of diameters of a plurality of randomly selected media (for example, beads). In a case of a non-spherical medium (for example, a non-spherical bead), it means an arithmetic mean of equivalent circle diameters of a plurality of randomly selected media, which is determined from an observation image obtained from a transmission electron microscope (TEM) or a scanning electron microscope (SEM). Examples of the medium material include glass, alumina, steel, zirconia, and ceramics. In a case of pulverizing with a cutter mill, the pulverizing conditions can be determined depending on the amount of the sintered product to be pulverized, the scale of the cutter mill to be used. In one form, the rotation speed of the cutter mill can be, for example, about 5,000 to 25,000 rpm.

(Surface Treatment Agent)

The powder of the substitution-type hexagonal ferrite is subjected to surface treatment with a surface treatment agent. Here, the surface treatment agent is a silicon-based compound. As a result of diligent examinations by the inventors of the present invention, it has been newly found that in a case where a powder of a substitution-type hexagonal ferrite subjected to surface treatment with a silicon-based compound and an olefin-based resin are in combination, it is possible to improve the radio wave absorption performance, the weather fastness, and the vibration damping property of the radio wave absorber.

Regarding the vibration damping property, it is possible to suppress the vibration of the article by converting the vibration energy applied to the article into thermal energy. For example, it can be said that the larger the value of the loss coefficient, which is said to be one of the indicators of the vibration damping property, the better the vibration damping property. It is presumed that with the combination of the substitution-type hexagonal ferrite powder subjected to surface treatment with a silicon-based compound, as a magnetic powder, and an olefin-based resin as a binder, it is possible to increase the compatibility and the bonding strength between the particles that constitute the magnetic powder and the binder, and as a result, it is possible to delay the response to mechanical deformation at the interface between the particles and the binder, which leads to an increase in the value of the loss coefficient.

Further, regarding the weather fastness, the interaction between the particles that constitute the magnetic powder and the binder can contribute to the improvement of the weather fastness. Regarding this interaction, it is conceived that in a case where the compatibility and the bonding strength between the particles that constitute the magnetic powder and the binder are high, aqueous moisture such as rainwater and moisture in the atmosphere does not easily permeate into the radio wave absorber. It is conceived that this makes it possible to suppress the deterioration of the radio wave absorber due to the permeation of moisture, which leads to the improvement of weather fastness.

However, the above is speculation and thus does not limit the present invention.

The powder of the substitution-type hexagonal ferrite contained in the radio wave absorbing composition and the radio wave absorber is subjected to surface treatment with a silicon-based compound. In the present invention and the present specification, the "silicon-based compound" means a compound containing silicon. The silicon-based compound can be an organic compound or an inorganic compound and are preferably an organic compound from the viewpoint of further improving the thermal cycle characteristics and the cutting workability.

At least a part of groups contained in the silicon-based compound that can be used as the surface treatment agents described below can be a group having reactivity. The group having reactivity means a group that can react with another group or a bond, in which the structure after reaction is different from that before reaction. After the surface treatment, the reactive group of the surface treatment agent may be present in the post-reaction form in a state where the surface treatment agent is applied onto the powder of the substitution-type hexagonal ferrite, and such an aspect is also included in the present invention.

Silicon-Based Compound

Examples of the silicon-based compound suitable as the surface treatment agent include a silicon-based compound represented by General Formula 2.

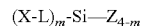

General Formula 2:

In General Formula 2, X represents a hydrogen atom, an alkyl group, an alkenyl group, an aryl group, an alicyclic group, a heterocyclic group, a hydroxy group, an acrylamide group, a sulfanyl group, an isocyanate group, a thiocyanate group, a ureido group, a cyano group, an acid anhydride group, an azide group, a carboxy group, an acyl group, a thiocarbamoyl group, a phosphate group, a phosphanyl group, a sulfonic acid group, or a sulfamoyl group.

L represents one divalent group or one bond, selected from the group consisting of a single bond, an alkylene group, an alkenylene group, an alkynylene group, an arylene group, —O—, —S—, —NR$^a$—, an ester bond, a thioester bond, an amide bond, a thioamide bond, and a sulfonyl group, or a divalent group or a bond, obtained by combining two or more of these, R$^a$ represents a hydrogen atom or a substituent.

Z represents a hydroxy group, an alkoxy group, or an alkyl group.

m is an integer in a range of 1 to 3.

The group represented by X as well as the group and the bond represented by L may have a substituent or can have no substituent (for example, can be unsubstituted). Examples of the substituent include a hydroxy group, a sulfanyl group, a thiocyanate group, a ureido group, an acid anhydride group, a carboxy group, an acyl group, and a carbamoyl group. In the present invention and the present specification, regarding a group having a substituent and a bond, the number of carbon atoms shall refer to the number of carbon atoms of a portion other than the substituent unless otherwise specified. In the structure represented by "X-L-", in a case where there is a portion that may be interpreted as a portion that is contained in X as well as a portion that is contained in L, such a portion shall be interpreted as a portion that is contained in X.

In a case where m is 2 or 3, a plurality of X's included in General Formula 2 can be the same in one form and can be different from each other in another form. This point also identically applies to L. In addition, the same also identically applies to Z in a case where "4-m" is 2 or 3.

Hereinafter, General Formula 2 will be described in more detail.

In General Formula 2, X represents a hydrogen atom, an alkyl group, an alkenyl group, an aryl group, an alicyclic group, a heterocyclic group, a hydroxy group, an acrylamide group, a sulfanyl group, an isocyanate group, a thiocyanate group, a ureido group, a cyano group, an acid anhydride group, an azide group, a carboxy group, an acyl group, a thiocarbamoyl group, a phosphate group, a phosphanyl group, a sulfonic acid group, or a sulfamoyl group.

The numbers of carbon atoms of the alkyl group, the alkenyl group, and the aryl group, that can be adopted as X, are each independently preferably in a range of 1 to 30, more preferably in a range of 1 to 25, still more preferably in a range of 1 to 20, and even still more preferably in a range of 1 to 15. Unless otherwise specified in the present invention and the present specification, the "alkyl group" shall not include a cycloalkyl group. The alkyl group includes a linear alkyl group and a branched alkyl group.

The alicyclic group that can be adopted as X may be any of a cycloalkyl group, a cycloalkenyl group, and a cycloalkynyl group. The number of carbon atoms of the cycloalkyl group is preferably in a range of 3 to 20, more preferably in a range of 4 to 15, and still more preferably in a range of 5 to 10. The numbers of carbon atoms of the cycloalkenyl group and the cycloalkynyl group are each independently preferably in a range of 6 to 20, more preferably in a range of 6 to 15, still more preferably in a range of 6 to 10, and even still more preferably 6.

The heterocyclic ring constituting a heterocyclic group that can be adopted as X may be a saturated or unsaturated aliphatic heterocyclic ring or aromatic heterocyclic ring, and may be a monocyclic ring or a fused ring. It may also be a bridged ring. Examples of the heteroatom contained in the heterocyclic ring include an oxygen atom, a nitrogen atom, and a sulfur atom. The number of heteroatoms contained in one heterocyclic ring is not particularly limited, and the heterocyclic ring has, for example, preferably 1 to 3 carbon atoms and more preferably 1 or 2 carbon atoms. The number of carbon atoms in the heterocyclic ring is preferably in a range of 2 to 10, and more preferably 4 or 5. The heterocyclic ring is preferably a 3-membered to 7-membered ring, more preferably a 3-membered to 6-membered ring, and still more preferably a 3-membered to 5-membered ring. Specific examples of the heterocyclic ring include an epoxy ring, a 3,4-epoxycyclohexane ring, a furan ring, and a thiophene ring. In one form, the heterocyclic group represented by X can be an epoxy group. In the present invention and the present specification, the "epoxy group" shall include an aspect in which the heterocyclic ring contained in the epoxy group is an epoxy ring (a 3-membered ring) and an aspect which includes a cyclic group having a structure in which an epoxy ring and a saturated hydrocarbon ring are fused. Examples of such a cyclic group include a 3,4-epoxycyclohexane ring.

The acid anhydride group that can be adopted as X is preferably a monovalent group having a structure of a carboxylic acid anhydride, and examples thereof include a maleic acid anhydride group such as 3,4-dihydro-2,5-furandionyl, a succinic acid anhydride group, a glutaric acid anhydride group, an adipic acid anhydride group, and a citraconic acid anhydride group.

The number of carbon atoms of the acyl group that can be adopted as X is preferably in a range of 1 to 40, more preferably in a range of 1 to 30, still more preferably in a range of 1 to 20, and even still more preferably in a range of 2 to 15. In the present invention and the present specification, the "acyl group" includes a formyl group, a carbamoyl group, an alkylcarbonyl group, an alkenylcarbonyl group, and an arylcarbonyl group. Examples of the alkenylcarbonyl group preferably includes a (meth)acryloyl group. In the present invention and the present specification, the "(meth)acryloyl group" includes an acryloyl group and a methacryloyl group.

The alkylene group that can be adopted as L may be any one of a linear alkylene group or a branched alkylene group. The number of carbon atoms of the alkylene group that can be adopted as X is preferably in a range of 1 to 30, more preferably in a range of 2 to 25, still more preferably in a range of 3 to 20, and even still more preferably in a range of 4 to 12. Specific examples of the alkylene group include a methylene group, an ethylene group, an isopropylene group, a butylene group, a pentylene group, a cyclohexylene group, a heptylene group, an octylene group, a nonylene group, a decylene group, and an undecylene group.

The alkenylene group that can be adopted as L may be any one of a linear alkenylene group or a branched alkenylene group. The number of carbon atoms of the alkenylene group that can be adopted as X is preferably in a range of 2 to 20, more preferably in a range of 2 to 15, still more preferably in a range of 2 to 10, and even still more preferably in a range of 2 to 6. Specific examples of the alkenylene group include an ethenylene group and a propenylene group.

The alkynylene group that can be adopted as L may be any one of a linear alkynylene group or a branched alkynylene group. The number of carbon atoms of the alkynylene group that can be adopted as X is preferably in a range of 2 to 20, more preferably in a range of 2 to 15, still more preferably in a range of 2 to 10, and even still more preferably in a range of 2 to 6. Specific examples of the alkynylene group include an ethynylene group and a propynylene group.

The number of carbon atoms of the arylene group that can be adopted as L is preferably in a range of 6 to 20, more preferably in a range of 6 to 15, still more preferably in a range of 6 to 12, and even still more preferably in a range of 6 to 10. Specific examples of the arylene group include a phenylene group and a naphthylene group.

Examples of the substituent as $R^a$ of —$NR^a$— that can be adopted as L include an alkyl group (preferably having 1 to 12 carbon atoms and more preferably 1 to 8 carbon atoms) an alkenyl group (preferably having 2 to 12 carbon atoms and more preferably having 2 to 8 carbon atoms) an alkynyl group (preferably having 2 to 12 carbon atoms and more preferably having 2 to 8 carbon atoms), an aryl group (preferably having 6 to 20 carbon atoms and more preferably having 6 to 10 carbon atoms), and a heterocyclic group. Examples of the heterocyclic ring constituting a heterocyclic group that can be adopted as $R^a$ include the heterocyclic ring described above as the heterocyclic ring constituting a heterocyclic group that can be adopted as X, and the preferred heterocyclic group is also as described for the heterocyclic group that can be adopted as X. Examples of —$NR^a$— include —NH—.

In a case where L represents a divalent group (hereinafter, also described as a "combined group that can be adopted as L") obtained by combining two or more selected from the group consisting of a single bond, an alkylene group, an alkenylene group, an alkynylene group, an arylene group, —O—, —S—, —$NR^a$—, an ester bond, a thioester bond, an amide bond, a thioamide bond, and a sulfonyl group, the numbers of the above-described groups and bonds, which constitute the combined group that can be adopted as L, are preferably in a range of 2 to 8, more preferably in a range of 2 to 6, and still more preferably in a range of 2 to 4.

The molecular weight of the combined group that can be adopted as L is preferably in a range of 20 to 1,000, more preferably in a range of 30 to 500, and still more preferably in a range of 40 to 200.

Examples of the combined group that can be adopted as L include a urea bond, a thiourea bond, a carbamate group, a sulfonamide bond, an arylene group-alkylene group, an —O-alkylene group, an amide bond-alkylene group, an —S-alkylene group, an alkylene group-O-amide bond-alkylene group, an alkylene group-amide bond-alkylene group, an alkenylene group-amide bond-alkylene group, an alkylene group-ester bond-alkylene group, an arylene group-ester bond-alkylene group, -(alkylene group-O)—, an alkylene group-O-(alkylene group-O)-alkylene group (here, any "(alkylene group-O)" is a repeating unit), an arylene group-sulfonyl group-O-alkylene group, and an ester bond-alkylene group.

Regarding the alkyl group constituting an alkoxy group that can be adopted as Z, the "alkyl group" includes a cycloalkyl group as well. The alkyl group constituting an alkoxy group that can be adopted as Z may be any one of a linear alkyl group, a branched alkyl group, or a cycloalkyl group, and it may have a combination of these forms. The alkyl group that can be taken as Z is preferably a linear alkyl group.

The number of carbon atoms of the alkyl group constituting an alkoxy group that can be adopted as Z, is preferably in a range of 1 to 15, more preferably in a range of 1 to 10, still more preferably in a range of 1 to 5, and even still more preferably 1 or 2. Specific examples of the alkyl group that constitutes an alkoxy group include a methyl group, an ethyl group, a propyl group, a t-butyl group, a pentyl group, and a cyclohexyl group.

Examples of the alkyl group that can be adopted as Z include an alkyl group constituting an alkoxy group that can be adopted as Z, and the preferred alkyl group is also as described for the alkyl group constituting an alkoxy group that can be adopted as Z.

In General Formula 2, X or L and at least one of Z's may be linked to each other to form a ring. The number of ring-constituting atoms in this ring is preferably in a range of 3 to 10, more preferably in a range of 4 to 8, and still more preferably 5 or 6.

In General Formula 2, X preferably represents a hydrogen atom, an alicyclic group, a heterocyclic group, an acrylamide group, a hydroxy group, a sulfanyl group, a thiocyanate group, an acid anhydride group, a carboxy group, an acyl group, or a sulfonic acid group. In addition, L preferably represents one divalent group or one bond, selected from the group consisting of an alkylene group, an alkenylene group, an alkynylene group, an arylene group, —O—, —S—, —$NR^a$—, an ester bond, a thioester bond, an amide bond, and a sulfonyl group, or a divalent group or a bond, obtained by combining two or more of these.

In one form, in General Formula 2, m can be 1, and X can represent an alkenyl group or a heterocyclic group. In another form, m can be 2 or 3, and a plurality of X's included in General Formula 2 can each independently represent an alkenyl group or a heterocyclic group.

In addition, in one form, in General Formula 2, m can be 1 and X can represent a (meth)acryloyl group, an acrylamide group, or an epoxy group. In another form, m can be 2 or 3, and a plurality of X's included in General Formula 2 can each independently represent a (meth)acryloyl group, an acrylamide group, or an epoxy group.

In one form, in General Formula 2, X preferably represents a (meth)acryloyl group, an acrylamide group, or an epoxy group. In addition, L more preferably represents one divalent group or one bond, selected from the group consisting of an alkylene group, an alkenylene group, —O—, —$NR^a$—, an ester bond, and an amide bond, or a divalent group or a bond, obtained by combining two or more of these.

In one form, in General Formula 2, it is preferable that at least two of Z's are selected from the group consisting of an alkoxy group and a hydroxy group, and it is more preferable that all Z's are selected from the group consisting of an alkoxy group and a hydroxy group.

In addition, from the viewpoint of further improving the cutting workability, a silicon-based compound containing an epoxy group is preferable, an epoxysilane is more preferable, and an epoxysilane having a large number of carbon atoms is still more preferable. This is presumed to be because the flexibility at the interface between the surface of the magnetic powder particles and the resin described later is increased. From this point, in General Formula 2, it is preferable that X represents an epoxy group, and it is more preferable that X represents an epoxy group and L includes an alkylene group having 4 to 12 carbon atoms.

Specific examples of the silicon-based compound that can be used as a surface treatment agent include various compounds that are used in Examples described later. In addition, specific examples of the silicon-based compound that can be used as a surface treatment agent include the following various compounds. However, the present invention is not limited to these specific examples.

Methyltriacetoxysilane,
ethyltriethoxysilane,
methyltriethoxysilane,
methyltrimethoxysilane,
n-propyltrimethoxysilane,
isopropyltrimethoxysilane,
n-hexyltrimethoxysilane,
n-dodecyltriethoxysilane,
n-octyltriethoxysilane,
n-octadecyltriethoxysilane,
pentyltriethoxysilane,
diacetoxydimethylsilane,
diethoxydimethylsilane,
dimethoxydimethylsilane,
dimethoxydiphenylsilane,
dimethoxymethylphenylsilane,
vinyldiethoxymethylsilane,
vinyltris(2-methoxyethoxy)silane,
p-styryltriethoxysilane,
naphthylltrimethoxysilane,
anthryltrimethoxysilane,
benzyltrimethoxysilane,
3-glycidyloxypropyl(dimethoxy)methylsilane,
diethoxy(3-glycidyloxypropyl)methylsilane,
3-(2-aminoethylamino)propyldimethoxymethylsilane,
3-(2-aminoethylamino)propyltriethoxysilane,
3-(2-aminoethylamino)propyltrimethoxysilane,
3-aminopropyldiethoxymethylsilane,
3-aminopropyltriethoxysilane,
3-aminopropyltrimethoxysilane,
(3-mercaptopropyl)triiethoxysilane,
(3-mercaptopropyl)trimethoxysilane,
3-isocyanate propyltriethoxysilane,
3-acryloxypropyltrimethoxysilane,
triethoxy-1H,1H,2H,2H-tridecafluoro-n-octylsilane,
2-cyanoethyltriethoxysilane,
thienyltrimethoxysilane,
pyridyltrimethoxysilane, and
furyltriethoxysilane.

In the present invention and the present specification, the silicon-based compound represented by General Formula 2 also includes a form of a salt of the compound represented by General Formula 2. Examples of the form of the salt thereof include an alkali metal salt such as a sodium salt or a potassium salt, an alkaline earth metal salt such as a magnesium salt, and an ammonium salt.

In addition, in one form, examples of the silicon-based compound include a silicone-based compound. Examples of the silicone-based compound include a polydimethylsiloxane, a polyalkylene oxide-modified silicone, a hydrogenated polysiloxane such as a hydrogen-terminated polydimethylsiloxane, a methylhydrosiloxane-dimethylsiloxane copolymer, and a polymethylhydrosiloxane. The molecular weight of the silicone-based compound is not particularly limited. In one form, the molecular weight of the silicone-based compound is preferably about 1 to 300,000 as a weight-average molecular weight. In one form, the liquid silicone-based compound preferably has a viscosity of 100 to 60,000 centistokes (cSt) (measurement temperature: 25° C.) from the viewpoint of surface treatment efficiency. In one form, the polyalkylene oxide-modified silicone preferably has an alkylene oxide content in a range of 10% to 90% by mass and more preferably in a range of 20% to 80% by mass. In one form, the content of the methylhydrosiloxane unit in the case of the hydrogenated polysiloxane is preferably in a range of 0.1% to 100% by mole and more preferably in a range of 2% to 50% by mole.

The silicon-based compound described above may be used alone, or two or more thereof can be used in combination at any ratio. In a case where a powder of a substitution-type hexagonal ferrite is subjected to surface treatment by subjecting the silicon-based compound (the surface treatment agent) to dry-type mixing or wet-type mixing with the powder of the substitution-type hexagonal ferrite, it is possible to coat at least a part of the surface of at least a part of particles that constitute the powder. As the surface treatment method, a known technique for surface treatment using a surface treatment agent can be adopted. The using amount of the surface treatment agent in the surface treatment is preferably in a range of 0.1 to 100 parts by mass and more preferably in a range of 0.5 to 20 parts by mass with respect to 100 parts by mass of the powder of the substitution-type hexagonal ferrite.

The radio wave absorbing composition and the radio wave absorber include, as a magnetic powder, a powder of a substitution-type hexagonal ferrite subjected to surface treatment with the surface treatment agent described above. In the radio wave absorbing composition and the radio wave absorber, the filling rate of the powder of the substitution-type hexagonal ferrite subjected to surface treatment with the surface treatment agent is not particularly limited. For example, the filling rate can be 35% by volume or less and can be also in a range of 15% to 35% by volume in terms of the volume filling rate. In addition, in one form, the volume filling rate can be 35% by volume or more. In this case, the volume filling rate can be, for example, in a range of 35% to 60% by volume and is preferably in a range of 35% to 50% by volume. Regarding the radio wave absorber, the volume filling rate described above means a volume-based content with respect to 100% by volume of the total volume of the radio wave absorber. Regarding the radio wave absorbing composition, the volume filling rate means a volume-based content of solid contents (that is, components excluding the solvent) with respect to 100% by volume of the total volume.

In addition, from the viewpoint of radio wave absorption performance, in the radio wave absorbing composition and the radio wave absorber, the powder of the substitution-type hexagonal ferrite subjected to surface treatment with a surface treatment agent is preferably contained in an amount of 10% by mass or more, more preferably 30% by mass or more, and still more preferably 50% by mass or more, with respect to the total mass (100% by mass) of this powder and the resin described later. On the other hand, from the viewpoint of weather fastness, in the radio wave absorbing composition and the radio wave absorber, the powder of the substitution-type hexagonal ferrite subjected to surface treatment with a surface treatment agent is preferably contained in an amount of 90% by mass or less, more preferably 80% by mass or less, and still more preferably 75% by mass or less, with respect to the total mass (100% by mass) of this powder and the resin described later.

<Binder>

The radio wave absorbing composition and the radio wave absorber include the magnetic powder and the binder. The binder is a resin, and the radio wave absorbing composition and the radio wave absorber contains an olefin-based resin as the binder. Combining the olefin-based resin with the powder of the substitution-type hexagonal ferrite subjected to surface treatment with a silicon-based compound can contribute to the improvement of the radio wave absorption performance, the weather fastness, and the vibration damping property of the radio wave absorber.

The olefin-based resin is a polymer having a polymerizable component containing at least olefin (a double bond-containing compound). In the present invention and the present specification, the "polymer" and the "resin" can be a homopolymer or a copolymer. Examples of the olefin include α-olefins such as ethylene, propylene, 1-butene, and 4-methyl-1-pentene. Examples of the α-olefin polymer, that is, the poly-α-olefin, include polyethylene, polypropylene, polybutene, polymethylpentene. The polyethylene can be various kinds of polyethylene such as low-density polyethylene, medium-density polyethylene, high-density polyethylene, linear low-density polyethylene, linear ultra-low-density polyethylene, and metallocene-catalyzed linear short-chain branched polyethylene. Examples of the copolymer include a random copolymer and a block copolymer of a poly-α-olefin, a random copolymer of an α-olefin and an unsaturated fatty acid, and a graft copolymer of an α-olefin and an unsaturated fatty acid or anhydride thereof.

Examples of the random copolymer of an α-olefin and an unsaturated fatty acid include an ethylene-vinyl acetate resin, an ethylene-ethyl acrylate resin, an ethylene-acrylic acid resin, an ethylene-methacrylic acid resin, and an acid-modified olefin-based resin obtained by modifying polyethylene or polypropylene with an unsaturated carboxylic acid such as acrylic acid, methacrylic acid, maleic acid anhydride, fumaric acid, or itaconic acid.

Examples of the unsaturated fatty acid in the graft copolymer of an α-olefin and an unsaturated fatty acid or anhydride thereof include monobasic unsaturated fatty acids such as acrylic acid and methacrylic acid, and anhydrides thereof; and dibasic unsaturated fatty acids such as maleic acid, fumaric acid, and itaconic acid, and anhydrides thereof. Examples of the graft copolymer of an α-olefin and an unsaturated fatty acid or anhydride thereof include a maleic acid-grafted ethylene-vinyl acetate resin, a maleic acid-grafted ethylene-α-olefin resin, and an ethylene-methacrylate-glycidylacrylate ternary polymer.

In one form, the olefin-based resin can be a polymer having a polymerizable component containing at least cycloolefin, that is, a cycloolefin resin.

Examples of the cycloolefin include bicyclic cycloolefins such as norbornene, norbornadiene, methylnorbornene, dimethylnorbornene, ethylnorbornene, chlorinated norbornene, chloromethylnorbornene, trimethylsilylnorbornene, phenylnorbornene, cyanonorbornene, dicyanonorbornene, methoxycarbonylnorbornene, pyridylnorbornene, a nadic acid anhydride, and a nadic acid imide; tricyclic cycloolefins such as dicyclopentadiene, dihydrodicyclopentadiene, alkyl-substituted products thereof, alkenyl-substituted products thereof, alkylidene-substituted products thereof, and aryl-substituted products thereof; tetracyclic cycloolefins such as dimethanohexahydronaphthalene, dimethanooctahydronaphthalene, alkyl-substituted products thereof, alkenyl-substituted products thereof, alkylidene-substituted products thereof, and aryl-substituted products thereof; pentacyclic cycloolefins such as tricyclopentadiene; and hexacyclic cycloolefins such as hexacycloheptadecene. In addition, examples thereof include dinorbornene, a compound in which two norbornene rings are bonded by a hydrocarbon chain or an ester group, and alkyl-substituted products thereof, aryl-substituted products thereof, or the like, which is a compound containing a norbornene ring.

Examples of the cycloolefin resin include a polymer of cycloolefin, and a hydrogen-added product thereof; a copolymer of cycloolefin and another olefin such as ethylene, and a hydrogen-added product thereof; and various cycloolefin resins (cycloolefin co-polymer; COC) such as a copolymer of cycloolefin and another polymerizable compound. Examples of the cycloolefin resin which is a copolymer of cycloolefin and another polymerizable compound include an ethylene-norbornene resin and a dicyclopentadiene resin.

In one form, the olefin-based resin can be one or more resins selected from the group consisting of polyethylene, polypropylene, polymethylpentene, an ethylene-vinyl acetate resin, a cycloolefin resin, and an olefin-based resin containing a maleic acid anhydride unit. The "olefin-based resin containing a maleic acid anhydride unit" is a polymer having a polymerizable component containing olefin and a maleic acid anhydride. Specific examples thereof include an ethylene-vinyl acetate-maleic acid anhydride resin, a maleic acid anhydride graft-polyethylene resin, an ethylene-acrylic acid ester-maleic acid anhydride resin. Here, the notation "-" regarding the resin is used to represent a copolymer. For example, the "ethylene-vinyl acetate resin" is a copolymer of polymerizable components containing ethylene and vinyl acetate. In addition, for example, the "ethylene-vinyl acetate-maleic acid anhydride resin" is a copolymer of polymerizable components containing ethylene, vinyl acetate, and a maleic acid anhydride, and it is also an ethylene-vinyl acetate resin and is an olefin-based resin containing a maleic acid anhydride unit" as well.

In the polymer component, the "molecular weight" in the present invention and the present specification means the weight-average molecular weight. The molecular weight of the olefin-based resin is not particularly limited. In one form, the lower limit of the weight-average molecular weight (Mw) is preferably 10,000 or more, more preferably 20,000 or more, and still more preferably 50,000 or more, from the viewpoint that a vibration damping property and weather fastness tend to be easily exhibited. In addition, in one form, the upper limit thereof is preferably 1,000,000 or less and more preferably 500,000 or less from the same viewpoint as described above. The "weight-average molecular weight" in the present invention and the present specification means a relative molecular weight with respect to the molecular weight of the standard polystyrene, which is analyzed by gel permeation chromatography using o-dichlorobenzene as the mobile phase.

In addition, in one form, the olefin-based resin can be one or more resins selected from the group consisting of polymethylpentene, a cycloolefin resin, and an olefin-based resin containing a maleic acid anhydride unit.

Specific examples of the commercially available product of the olefin-based resin include high-density polyethylene (HDPE; HI-ZEX 232J manufactured by Prime Polymer Co., Ltd.), polypropylene (PP; NOVATEC MA3 manufactured by Japan Polypropylene Corporation), an ethylene-vinyl acetate resin (EVA; Ultrathene 537 manufactured by Tosoh Corporation), an ethylene-vinyl acetate-maleic acid anhydride resin (OREVAC T 9314 manufactured by Arkema S.A.), a maleic acid anhydride graft-polyethylene resin (OREVAC G OE808 manufactured by Arkema S.A.), an ethylene-acrylic acid ester-maleic acid anhydride resin (BONDINE 5500 manufactured by Arkema S.A.), a cycloolefin resin (ZEONOR 1020R manufactured by ZEON CORPORATION), a polymethylpentene resin (TPX RT18 manufactured by Mitsui Chemicals, Inc.), an ethylene-norbornene resin (Topas 8007S-04 manufactured by Polyplastics Co., Ltd.), a dicyclopentadiene resin (METTON T02 manufactured by RIMTEC Corporation), a cycloolefin resin (APEL APL8008T manufactured by Mitsui Chemicals, Inc.), and a cycloolefin resin (ARTON D4000 manufactured by JSR Corporation).

The radio wave absorbing composition and the radio wave absorber may contain only one kind of the resin or may contain two or more kinds of the resins in any ratio. The filling rate of the olefin-based resin in the radio wave absorbing composition and the radio wave absorber is not particularly limited; however, the volume filling rate thereof is, for example, preferably 65% by volume or more, more preferably 65% by volume or more and 92% by volume or less, and still more preferably 65% by volume or more and 85% by volume or less. In a case where the radio wave absorbing composition and the radio wave absorber contain two or more kinds of olefin-based resins, the filling rate shall refer to the total filling rate of two or more kinds of olefin-based resins. This point also identically applies to the filling rates of other components.

<Additive>

The radio wave absorbing composition and the radio wave absorber contain the powder of the substitution-type hexagonal ferrite subjected to surface treatment with a silicon-based compound and the olefin-based resin, and may optionally contain one or more additives. Examples of the additive include a dispersing agent, a dispersing auxiliary agent, a fungicide, an antistatic agent, and an antioxidant. One component of the additive may carry out two or more functions. The radio wave absorbing composition and the radio wave absorber can contain, as the additive, a commercially available product or a product produced by a known method at any filling rate.

<Methods of Manufacturing Radio Wave Absorbing Composition and Radio Wave Absorber>

The methods of manufacturing the radio wave absorbing composition and the radio wave absorber are not particularly limited. The radio wave absorbing composition of the present disclosure can be manufactured by a known method using the magnetic powder, an olefin-based resin, and, as necessary, a solvent, an additive, and the like. For example, the radio wave absorber can be a molded product formed by molding the radio wave absorbing composition. The radio wave absorbing composition can be prepared as a kneaded material by kneading, while heating, a mixture of the magnetic powder, the resin, and, as necessary, a solvent, additives, and the like. The kneaded material can be obtained, for example, as a pellet. The kneaded material is molded into a desired shape by a known molding method such as extrusion molding, press molding, injection molding, or in-mold forming, whereby a radio wave absorber (a molded product) can be obtained. The shape of the radio wave absorber is not particularly limited and may be any shape such as a plate shape or a linear shape. The "plate shape" includes a sheet shape and a film shape. The plate-shaped radio wave absorber can also be called a radio wave absorbing plate, a radio wave absorbing sheet, a radio wave absorbing film, or the like. The radio wave absorber may be a radio wave absorber having a single constitution (for example, a single-layer radio wave absorbing plate) or a combination of two or more parts having different constitutions (for example, a laminate). Further, the radio wave absorber may have a planar shape, may have a three-dimensional shape, or may be a combination of a portion having a planar shape and a portion having a three-dimensional shape. Examples of the planar shape include a sheet shape and a film shape. Examples of the three-dimensional shape include a tubular shape (a cylindrical shape, rectangular tubular shape, or the like), a horn shape, and a box shape (for example, at least one of the surfaces thereof is open).

For example, the thickness of the radio wave absorber is preferably 20.0 mm or less, more preferably 10.0 mm or less, and still more preferably 5.0 mm or less, from the viewpoint of easiness of handling. From the viewpoint of mechanical properties, the thickness thereof is preferably 1.0 mm or more and more preferably 2.0 mm or more. In a case where the thickness of the radio wave absorber is adjusted, for example, the transmission attenuation amount described later can be controlled. In a case where the radio wave absorber is a laminate, the thickness means the total thickness of the radio wave absorber that constitutes the laminate. The thickness of the radio wave absorber is a value measured using a digital length measuring machine and, specifically, is an arithmetic mean of the measured values measured at nine points which are randomly selected.

The radio wave absorbing composition may contain or may not contain a solvent. In a case where the radio wave absorbing composition contains a solvent, the solvent is not particularly limited, and examples thereof include water, an organic solvent, and a mixed solvent of water and an organic solvent.

Examples of the organic solvent include alcohols such as methanol, ethanol, n-propanol, i-propanol, and methoxypropanol, ketones such as acetone, methyl ethyl ketone, and cyclohexanone, tetrahydrofuran, acetonitrile, ethyl acetate, and toluene. Among these, the solvent is preferably ketones and more preferably cyclohexanone from the viewpoint of drying rate. In a case where the radio wave absorbing composition contains a solvent, the content of the solvent in the composition is not particularly limited and may be determined depending on the method of manufacturing a radio wave absorber.

The radio wave absorbing composition can be prepared by mixing the above components. The mixing method is not particularly limited, and examples thereof include a method of mixing by stirring. As the stirring unit, a known stirring device can be used. Examples of the stirring device include mixers such as a paddle mixer and an impeller mixer. The stirring time may be set depending on the kind of the stirring device, the constitution of the radio wave absorbing composition, and the like.

Examples of one form of the method of manufacturing the radio wave absorber include a method of molding the radio wave absorbing composition into a desired shape by a known molding method as exemplified above.

In addition, examples of another form of the method of manufacturing the radio wave absorber include a method of applying the radio wave absorbing composition onto a support and producing the radio wave absorber as a radio wave absorbing layer. The support that is used here may be removed before the radio wave absorber is incorporated into an article to which the radio wave absorbability should be imparted or may be incorporated into the article together with the radio wave absorber without being removed.

The support is not particularly limited, and a well known support can be used. Examples of the support include a metal plate (a plate of metal such as aluminum, zinc, or copper), a glass plate, a plastic sheet [a sheet of polyester (polyethylene terephthalate, polyethylene naphthalate, or polybutylene terephthalate), polyethylene (linear low-density polyethylene, low-density polyethylene, or high-density polyethylene), polypropylene, polystyrene, polycarbonate, polyimide, polyamide, polyamide imide, polysulfone, polyvinyl chloride, polyacrylonitrile, polyphenylene sulfide, polyether imide, polyether sulfone, polyvinyl acetal, or an acrylic resin], a plastic sheet on which the metal exemplified in the metal plate described above is laminated or vapor-deposited. The plastic sheet is preferably biaxially stretched. The shape, structure, size, and the like of the support can be appropriately selected.

Examples of the shape of the support include a plate shape. The structure of the support may be a monolayer structure or a laminated structure of two or more layers. The size of the support can be appropriately selected depending on the size of the radio wave absorber. The thickness of the support is generally approximately 0.01 mm to 10 mm, for example, preferably 0.02 mm to 3 mm and more preferably 0.05 mm to 1 mm, from the viewpoint of handleability.

The method of applying the radio wave absorbing composition on a support is not particularly limited, and examples thereof include methods using a die coater, a knife coater, an applicator. The method of drying the coating film formed by applying the radio wave absorbing composition is not particularly limited, and examples thereof include a method using a known heating device such as an oven. The drying temperature and the drying time are not particularly limited. For example, the drying temperature can be in a range of 70° C. to 90° C., and the drying time can be in a range of 1 hour to 3 hours.

The radio wave absorber can be incorporated into various articles to which radio wave absorbability is desired to be imparted. For example, the plate-shaped radio wave absorber can be incorporated into an article in any form as it is or by being bent at any portion. In addition, it can be adjusted to a desired shape by injection molding or the like to be incorporated into an article.

A radio wave absorber having excellent radio wave absorption performance is useful for improving the recognition accuracy of radar. Examples of the indicator of the radio wave absorption performance include the transmission attenuation amount. For example, the transmission attenuation amount of the radio wave absorber can be 6.0 dB or more. In order to improve the recognition accuracy of the radar, it is desirable to increase the directivity of the radar. A high transmission attenuation amount can contribute to the improvement of the directivity of the radar. From the viewpoint of further improving the directivity of the radar, the transmission attenuation amount of the radio wave absorber is preferably 8.0 dB or more, more preferably 8.5 dB or more, still more preferably 9.0 dB or more, and even still more preferably 10.0 dB or more. The transmission attenuation amount of the radio wave absorber can be, for example, 15.0 dB or less, 14.5 dB or less, 14.0 dB or less, 13.5 dB or less, 13.0 dB or less, 12.5 dB or less, or 12.0 dB or less. However, from the viewpoint of improving the directivity of the radar, it is preferable that the transmission attenuation amount of the radio wave absorber is high. Accordingly, the transmission attenuation amount of the radio wave absorber may exceed the values exemplified above.

Further, the reflection attenuation amount of the radio wave absorber can be, for example, 6.0 dB or more. In order to improve the recognition accuracy of the radar, it is desirable to enhance the selectivity of the radar by removing or reducing unnecessary radio wave components with the radio wave absorber, where the selectivity is receiving radio waves selectively from an object. A high reflection attenuation amount can contribute to the removal or reduction of unnecessary radio wave components. From this point, the reflection attenuation amount of the radio wave absorber is preferably 8.0 dB or more, more preferably 8.5 dB or more, still more preferably 9.0 dB or more, and even still more preferably 10.0 dB or more. The reflection attenuation amount of the radio wave absorber can be, for example, 18.0 dB or less, 17.5 dB or less, 17.0 dB or less, 16.5 dB or less, 16.0 dB or less, 15.5 dB or less, or 15.0 dB or less. However, from the viewpoint of removing or reducing unnecessary radio wave components, it is preferable that the reflection attenuation amount of the radio wave absorber is high. Accordingly, the reflection attenuation amount of the radio wave absorber may exceed the values exemplified above.

By the way, the on-vehicle radar, which has been attracting attention in recent years, is a radar that uses radio waves in the millimeter wave frequency band. The millimeter waves are electromagnetic waves having a frequency of 30 GHz to 300 GHz. The radio wave absorber preferably exhibits a transmission attenuation amount and a reflection attenuation amount in the above respective ranges with respect to a frequency of the radio wave, that is, one or more frequencies in the frequency band of 3 terahertz (THz) or less. From the viewpoint of usefulness for improving the recognition accuracy of the on-vehicle radar, the frequency at which the radio wave absorber exhibits a transmission attenuation amount and a reflection attenuation amount in the above range is preferably a millimeter wave frequency band, that is, one or more frequencies in the frequency band of 30 GHz to 300 GHz, more preferably one or more frequencies in the frequency band of 60 GHz to 90 GHz, and still more preferably one or more frequencies in the frequency band of 75 GHz to 85 GHz. As an example, the radio wave absorber can be a radio wave absorber having a transmission attenuation amount at a frequency of 76.5 GHz and a reflection attenuation amount at a frequency of 76.5 GHz in the above respective ranges. Such a radio wave absorber is suitable as a radio wave absorber that is incorporated on a front side (an incident side of the radio wave incident from the outside) of the radio wave transmitting and receiving unit in the on-vehicle radar in order to reduce the side lobe of the on-vehicle millimeter-wave radar.

The "transmission attenuation amount" in the present invention and the present specification is a value obtained by measuring an S parameter in a measurement environment at an ambient temperature of 15° C. to 35° C. with a free space method by setting an incidence angle of 0° and being determined as S21 of the S parameter. The "reflection attenuation amount" is a value determined as S11 of the S parameter by the same measurement. The measurement can be carried out using a known vector network analyzer and horn antenna. Examples of the specific example of the measurement method include the methods described in Examples described later.

By the way, in a radio wave absorber, a metal layer may be laminated on a surface (a so-called back surface) opposite to the surface on which radio waves are incident on the radio wave absorber. Such a radio wave absorber is called a matching-type radio wave absorber. In the matching-type radio wave absorber, reflection attenuation characteristics can be enhanced by providing a metal layer to utilize the phase difference absorption. On the other hand, in one form, in the radio wave absorber, the radio wave absorber itself can have excellent reflection attenuation characteristics. Specifically, in one form, the radio wave absorber can exhibit a high reflection attenuation amount regardless of the metal layer. A radio wave absorber that is used without laminating a metal layer on the back surface is generally called a transmission-type radio wave absorber. In the conventional transmission-type radio wave absorber containing a magnetic powder and a binder, in general, the reflection attenuation amount tended to decrease in a case where an attempt was made to increase the transmission attenuation amount. On the other hand, in one form, the radio wave absorber can exhibit a high reflection attenuation amount and a high transmission attenuation amount regardless of the metal layer.

The "metal layer" described in the present specification means a layer containing a metal and substantially reflecting radio waves. However, in a case where the radio wave absorber containing a magnetic powder and a binder contains a metal, such a radio wave absorber does not correspond to the metal layer. Here, "substantially reflecting radio waves" means, for example, reflecting 90% or more of incident radio waves in a case where the radio waves are incident on the radio wave absorber in a state where a metal layer is laminated on the back surface of the radio wave absorber. Examples of the form of the metal layer include a metal plate and a metal foil. For example, a metal layer formed on the back surface of the radio wave absorber by vapor deposition can be mentioned. In one form, the radio wave absorber can be used without a metal layer being provided on the back surface. The fact that the radio wave absorber can be used without a metal layer is preferable from the viewpoint of recycling and the viewpoint of cost. In addition, the quality of the radio wave absorber that is used by laminating a metal layer on the back surface may deteriorate due to the deterioration of the metal layer, the peeling of the metal layer from the radio wave absorber. The fact that it can be used without a metal layer being provided on the back surface is also preferable in that such quality deterioration does not occur.

EXAMPLES

Hereinafter, the present invention will be described based on Examples. However, the present invention is not limited to aspects described in Examples. Unless otherwise specified, steps and evaluations described below were carried out in an environment of an ambient temperature of 23° C.±1° C.

[Production of Magnetic Powder]

<Production of Magnetic Powder A-1 (Powder of Substitution-Type Hexagonal Strontium Ferrite)>

A total amount of a raw material aqueous solution prepared by dissolving 57.0 g of iron (III) chloride hexahydrate [$FeCl_3 \cdot 6H_2O$], 27.8 g of strontium chloride hexahydrate [$SrCl_2 \cdot 6H_2O$], and 10.7 g of aluminum chloride hexahydrate [$AlCl_3 \cdot 6H_2O$] in 216.0 g of water, and a total amount of a solution prepared by adding 113.0 g of water to 181.3 g of an aqueous solution of sodium hydroxide of a concentration of 5 mol/L were added to 400.0 g of water kept at a temperature of 35° C. and stirred, respectively, at a flow rate of 10 mL/min and the same timing, to obtain a first solution.

Next, after changing the solution temperature of the first solution to be 25° C., 24.7 g of an aqueous solution of sodium hydroxide of a concentration of 1 mol/L was added while maintaining this temperature to obtain a second solution. The pH of the second solution was 9.0. The pH of the second solution was measured using a desktop pH meter (F-71 manufactured by HORIBA, Ltd.).

Next, the second solution was stirred for 15 minutes, and a solution containing a reaction product which is a precursor of magnetoplumbite-type hexagonal ferrite (a precursor-containing solution) was obtained.

Next, the precursor-containing solution was subjected to the centrifugal separation treatment [rotation speed: 3,000 rpm, rotation time: 10 minutes] three times, and the obtained precipitate was collected.

Next, the collected precipitate was dried in an oven at an internal ambient temperature of 80° C. for 12 hours to obtain a precursor powder.

Next, the precursor powder was put in a muffle furnace, and the temperature in the furnace was set to 1,100° C. in an ambient air atmosphere, followed by sintering for 4 hours, thereby obtaining a sintered product.

Next, the obtained sintered product was pulverized for 90 seconds using a cutter mill pulverizer (Wonder Crusher WC-3 manufactured by Osaka Chemical Co., Ltd.) as the pulverizer, with the variable speed dial of the pulverizer being set to "5" (rotation speed: about 10,000 to 15,000 rpm).

As a result, a magnetic powder A-1 was obtained.

<Production of Magnetic Powders A-2 to A-7 (Powder of Substitution-Type Hexagonal Strontium Ferrite)>

The same operation as in the production of the magnetic powder A1 was carried out except that the pH of the second solution was adjusted to the pH shown in Table 1 described later, to obtain magnetic powders A-2 to A-7.

<Production of Magnetic Powder A-8 (Powder of Unsubstitution-Type Hexagonal Strontium Ferrite)>

15.02 g of strontium carbonate [$SrCO_3$] and 90.24 g of iron oxide [$Fe_2O_3$] were mixed and pulverized in an agate mortar to obtain a powder of a precursor of the magnetoplumbite-type hexagonal ferrite was.

Next, the precursor powder was put in a muffle furnace, and the temperature in the furnace was set to 1,200° C. in an ambient air atmosphere, followed by sintering for 4 hours, thereby obtaining a sintered product.

Next, the obtained sintered product was pulverized for 90 seconds using a cutter mill pulverizer (Wonder Crusher WC-3 manufactured by Osaka Chemical Co., Ltd.) as the pulverizer, with the variable speed dial of the pulverizer being set to "5" (rotation speed: about 10,000 to 15,000 rpm).

As a result, a magnetic powder A-8 was obtained.

<Checking of Crystal Structure>

The crystal structure of the magnetic material that constitutes each of the above magnetic powders was checked by X-ray diffraction analysis. As the measurement device, X'Pert Pro manufactured by PANalytical Co., Ltd., which is a powder X-ray diffractometer, was used. The measurement conditions are shown below.

—Measurement Conditions—

X-ray source: CuKα ray
[Wavelength: 1.54 Å (0.154 nm), output: 40 mA, 45 kV]
Scan range: 20°<2θ<70°
Scan interval: 0.05°
Scan speed: 0.75°/min As a result of the X-ray diffraction analysis, it was confirmed that the magnetic powders A-1 to A-8 have a magnetoplumbite-type crystal structure and are a single-phase powder of a magnetoplumbite-type hexagonal ferrite that does not include a crystal structure other than the magnetoplumbite-type crystal structure.

<Checking of Constitution>

The constitution of the magnetic material that constitutes each of the above magnetic powders was checked by high frequency inductively coupled plasma emission spectroscopy. Specifically, the checking was carried out by the following method.

A container beaker containing 12 mg of the magnetic powder and 10 mL of an aqueous solution of hydrochloric acid of a concentration of 4 mol/L was held on a hot plate at a set temperature of 120° C. for 3 hours to obtain a dissolution solution. 30 mL of pure water was added to the obtained dissolution solution, which is then filtered using a membrane filter having a filter pore diameter of 0.1 µm. Elemental analysis of the filtrate obtained as described above was carried out using a high frequency inductively coupled plasma emission spectrometer [ICPS-8100, manufactured by Shimadzu Corporation]. Based on the obtained elemental analysis results, a content of each atom with respect to 100% by atom of iron atoms was obtained. Then, based on the obtained content, the constitution of the magnetic material was checked. As a result, it was confirmed that the constitutions of the magnetic powders A-1 to A-7 were such that A in General Formula 1 is Sr and x is the value shown in Table 1. Further, it was confirmed that the magnetic powder A-8 has a constitution of $SrFe_{12}O_{19}$ (that is, it was an unsubstitution-type strontium ferrite).

The resonance frequencies of the magnetic powders A-1 to A-7 were measured by the following method. The measurement results are shown in Table 1.

(Method of Measuring Resonance Frequency)

Using each magnetic powder, a sheet sample for resonance frequency measurement was produced by the following method.

9.0 g of the magnetic powder, 1.05 g of the acrylonitrile butadiene rubber (NBR) (JSR N215SL, manufactured by JSR Corporation), and 6.1 g of cyclohexanone (a solvent) were stirred and mixed with a stirring device [Awatori Neritaro ARE-310, manufactured by Shinky Co., Ltd.], at a rotation speed of 2,000 rpm for 5 minutes to prepare a composition for producing a sheet sample.

Next, the prepared composition was applied onto a glass plate (a support) using an applicator to form a coating film of the above composition.

Next, the formed coating film was dried in an oven having an internal ambient temperature of 80° C. for 2 hours, and then the sheet sample (thickness: 0.3 mm) was peeled off from the glass plate.

Using the sheet sample obtained as described above, a vector network analyzer (product name: N5225B) manufactured by Keysight Technologies and a horn antenna (product name: RH12S23) manufactured by KEYCOM Corp were used to measure an S parameter according to the free space method by setting an incidence angle to 0° and a sweep frequency to 60 GHz to 90 GHz. From this S parameter, a peak frequency of permeability µ." of the imaginary part was calculated using the Nicholson-Loss model method and this peak frequency was used as the resonance frequency. The results are shown in Table 1.

TABLE 1

|  | Magnetic powder A-1 | Magnetic powder A-2 | Magnetic powder A-3 | Magnetic powder A-4 | Magnetic powder A-5 | Magnetic powder A-6 | Magnetic powder A-7 |
|---|---|---|---|---|---|---|---|
| pH of second solution | 9.0 | 9.5 | 10.0 | 10.5 | 11.0 | 11.5 | 12.0 |
| Value of x | 2.35 | 2.28 | 2.21 | 2.14 | 2.00 | 1.87 | 1.80 |
| Resonance frequency [GHz] | 87.2 | 85.1 | 82.3 | 79.8 | 76.5 | 72.8 | 69.3 |

From the results shown in Table 1, it can be confirmed that the value of x (that is, the Al content) in General Formula 1 can be controlled by adjusting the pH of the second solution. Furthermore, it can be confirmed that the resonance frequency of the magnetic powder can be controlled by controlling the Al content. It can be said that the higher the resonance frequency of the magnetic powder, the better the radio wave absorption performance in the high frequency band.

<Production of Magnetic Powder R-1 Subjected to Surface Treatment with Surface Treatment Agent>

20 g of the magnetic powder A-1 obtained as described above and 0.2 g of a surface treatment agent SP-3 (allyltrimethoxysilane) were mixed for 60 seconds using a cutter mill pulverizer (Wonder Crusher WC-3 manufactured by Osaka Chemical Co., Ltd.) with the variable speed dial of the pulverizer being set to "3".

Next, the mixed powder was placed in an oven at a set temperature of 90° C. and dried by heating for 3 hours to obtain a magnetic powder R-1 subjected to surface treatment with a surface treatment agent.

<Production of Magnetic Powders R-2 to R-29 Subjected to Surface Treatment With Surface Treatment Agent>

The same operation as in the production of the magnetic powder R-1 was carried out except that the magnetic powder shown in Table 2 was used and the using amount shown in Table 2 was used for the surface treatment agent shown in Table 2, whereby magnetic powders R-2 to R-29 subjected to surface treatment were obtained.

Details of the magnetic powders R-1 to R-29 are shown in Table 2 (Tables 2-1 to 2-3). The using amount of the surface treatment agent in the table below is the amount with respect to 100 parts by mass of the magnetic powder subjected to surface treatment.

TABLE 2-1

| Magnetic powder subjected to surface treatment | | R-1 | R-2 | R-3 | R-4 | R-5 | R-6 | R-7 | R-8 | R-9 | R-10 |
|---|---|---|---|---|---|---|---|---|---|---|---|
| Powder | Kind | A-1 | A-2 | A-3 | A-4 | A-5 | A-6 | A-7 | A-5 | A-5 | A-5 |
| Surface treatment agent | Kind | SP-3 | SP-3 | SP-3 | SP-3 | SP-3 | SP-3 | SP-3 | SK-1 | SK-2 | SK-3 |
| | Using amount [part by mass] | 1.0 | 1.0 | 1.0 | 1.0 | 1.0 | 1.0 | 1.0 | 1.0 | 1.0 | 1.0 |

TABLE 2-2

| Magnetic powder subjected to surface treatment | | R-11 | R-12 | R-13 | R-14 | R-15 | R-16 | R-17 | R-18 | R-19 | R-20 |
|---|---|---|---|---|---|---|---|---|---|---|---|
| Powder | Kind | A-5 | A-5 | A-5 | A-5 | A-5 | A-5 | A-5 | A-5 | A-5 | A-5 |
| Surface treatment agent | Kind | SV-1 | SV-2 | SV-3 | SV-4 | SV-5 | SP-1 | SP-2 | SP-4 | SI-1 | SI-2 |
| | Using amount [part by mass] | 1.0 | 1.0 | 1.0 | 1.0 | 1.0 | 1.0 | 1.0 | 1.0 | 1.0 | 1.0 |

TABLE 2-3

| Magnetic powder subjected to surface treatment | | R-21 | R-22 | R-23 | R-24 | R-25 | R-26 | R-27 | R-28 | R-29 |
|---|---|---|---|---|---|---|---|---|---|---|
| Powder | Kind | A-5 | A-5 | A-5 | A-5 | A-5 | A-5 | A-5 | A-8 | A-5 |
| Surface treatment agent | Kind | SI-3 | SP-3 | SP-3 | SP-3 | SP-3 | SP-3 | SP-3 | SP-3 | ST-1 |
| | Using amount [part by mass] | 1.0 | 0.2 | 0.5 | 1.5 | 2.0 | 5.0 | 10.0 | 1.0 | 1.0 |

The surface treatment agents in Table 2 are the following surface treatment agents.

[Surface Treatment Agent]

SK-1: Allyltrimethoxysilane (SIA0540.0 manufactured by Gelest Inc.)

SK-2: Phenethyldimethoxysilane (SIP6722.6 manufactured by Gelest Inc.)

SK-3: [2-(3-cyclohexenyl)ethyl]trimethoxysilane (SIC2460.0 manufactured by Gelest Inc.)

SV-1: Vinyl trimethoxysilane (KBM-1003 manufactured by Shin-Etsu Chemical Co., Ltd.)

SV-2: 7-octenyltrimethoxysilane (KBM-1083 manufactured by Shin-Etsu Chemical Co., Ltd.)

SV-3: (3-methacryloxypropyl)trimethoxysilane (SIM6487.4 manufactured by Gelest Inc.)

SV-4: 8-methacryloxyoctyltrimethoxysilane (KBM-5803 manufactured by Shin-Etsu Chemical Co., Ltd.)

SV-5: 3-acrylamide propyltrimethoxysilane (SIA0146.0 manufactured by Gelest Inc.)

SP-1: 3-glycidylpropyltrimethoxysilane (SIG5840.0 manufactured by Gelest Inc.)

SP-2: 5,6-epoxyhexyltriethoxysilane (SIE4675.0 manufactured by Gelest Inc.)

SP-3: 8-glycidoxyoctyltrimethoxysilane (KBM-4803 manufactured by Shin-Etsu Chemical Co., Ltd.)

SP-4: 2-(3,4-epoxycyclohexyl)ethyltrimethoxysilane (SIE4670.0 manufactured by Gelest Inc.)

SI-1: Polydimethylsiloxane (DMS-T21 manufactured by Gelest Inc., weight-average molecular weight: 5,970)

SI-2: A polyalkylene oxide-modified silicone (DBE-621 manufactured by Gelest Inc., ethylene oxide content: 50%, weight-average molecular weight: 2,500)

SI-3: A hydrogen-terminated polydimethylsiloxane (DMS-H21 manufactured by Gelest Inc., weight-average molecular weight: 6,000)

ST-1: Tristearoyl isopropyl titanate (manufactured by AIM Co., Ltd.)

[Production of Radio Wave Absorber]

Example 1

3.0 g of the magnetic powder R-1, 2.0 g of the olefin-based resin B-1 (the ethylene-vinyl acetate-maleic acid anhydride resin), and 0.05 g of a hindered phenol compound (Irganox 1330 manufactured by BASF SE) as an antioxidant were introduced into a kneader (Labo Plastomill Micro manufactured by Toyo Seiki Co., Ltd.) at a set temperature of 160° C., mixed, and kneaded at a rotor rotation speed of 100 rpm for 5 minutes to obtain an aggregated kneaded material.

The obtained aggregated kneaded material was subjected to press molding using a heating press machine (heating temperature: 150° C., press time: 1 minute, pressure: 20 MPa) to produce a radio wave absorber (a radio wave absorbing sheet) having a length of 10.0 cm, a width of 10.0 cm, and a thickness 2.0 mm.

Examples 2 to 36

The same operation as in Example 1 was carried out except that a magnetic powder shown in Table 3 was used as the magnetic powder subjected to surface treatment with a surface treatment agent and an olefin-based resin shown in Table 3 was used, whereby a radio wave absorber (a radio wave absorbing sheet) was produced.

Examples 37 to 40

Regarding the content of the magnetic powder and the olefin-based resin in the mixture for preparing the kneaded material of Example 1, the magnetic powder is 60% by mass, and the olefin-based resin is 40% by mass, with respect to the total mass of the magnetic powder and the olefin-based resin. In Examples 37 to 40, the same operation as in Example 1 was carried out except that the contents of the magnetic powder and the olefin-based resin were changed as shown in Table 3, whereby a radio wave absorber (a radio wave absorbing sheet) was produced.

Comparative Example 1

The same operation as in Example 1 was carried out except that the magnetic powder R-1 was not used, whereby a sheet made of an olefin-based resin was produced.

Comparative Examples 2 and 3

The same operation as in Example 1 was carried out except that a magnetic powder (subjected to no surface treatment) shown in Table 3 was used as the magnetic powder, whereby a radio wave absorber (a radio wave absorbing sheet) was produced.

Comparative Example 4

The same operation as in Example 1 was carried out except that the magnetic powder (the powder of the unsubstitution-type hexagonal ferrite subjected to surface treatment with a surface treatment agent) shown in Table 3 was used as the magnetic powder, whereby a radio wave absorber (a radio wave absorbing sheet) was produced.

Comparative Example 5

The same operation as in Example 1 was carried out except that a magnetic powder R-29 subjected to surface treatment with a titanium-based compound ST-1 was used, whereby a radio wave absorber (a radio wave absorbing sheet) was produced.

In each of Examples and Comparative Examples described above, a plurality of sheets were produced, and each of the sheets was used for each of the following evaluations.

[Evaluation method]

(1) Radio Wave Absorption Performance

The transmission attenuation amount (unit: dB) and the reflection attenuation amount (unit: dB) of each of the sheets of Examples and Comparative Examples were measured by the following method.

As the measurement device, a vector network analyzer (product name: N5225B) manufactured by Keysight Technologies and a horn antenna (product name: RH12S23) manufactured by KEYCOM Corp. were used to measure an S parameter with a free space method by setting an incidence angle to 0° and a sweep frequency to 60 GHz to 90 GHz, with one plane of each of the sheets being directed toward the incident side, S21 of the S parameter at a frequency of 76.5 GHz was taken as the transmission attenuation amount, and S11 of the S parameter at a frequency of 76.5 GHz was taken as the reflection attenuation amount.

From the measured values, the radio wave absorption performance was evaluated according to the following standards.

(Evaluation Standards)

A: Both transmission attenuation amount and reflection attenuation amount are 10.0 dB or more.

B: Both transmission attenuation amount and reflection attenuation amount are 8.0 dB or more and less than 10.0 dB.

C: Both transmission attenuation amount and reflection attenuation amount are 6.0 dB or more and less than 8.0 dB.

D: Both transmission attenuation amount and reflection attenuation amount are less than 6.0 dB.

(2) Vibration Damping Property (Loss Coefficient)

A specimen having a length of 10.0 cm, a width of 1.27 cm, and a thickness of 2.0 mm was cut out from each of the sheets of Examples and Comparative Examples and subjected to the measurement in a temperature range of 0° C. to 80° C., and the value of the loss coefficient at 23° C. was calculated, according to the half-width method, from the peak of the second-order resonance of the frequency response function, which had been measured by the central vibration method based on JIS K7391: 2008. For the measurement, a system consisting of an oscillator of Type 3160, an amplifier of Type 2718, an exciter of Type 4810, and an acceleration sensor of Type 8001 was used (all manufactured by Brüel & Kjer), and a loss coefficient measurement software MS18143 installed in the above system was used to calculate the loss coefficient. The vibration damping property was evaluated according to the following standards.

(Evaluation Standards)

A: Loss coefficient is 0.12 or more.

B: Loss coefficient is 0.10 or more and less than 0.12.

C: Loss coefficient is 0.08 or more and less than 0.10.

D: Loss coefficient is less than 0.08.

(3) Weather Fastness

Each of the sheets of Examples and Comparative Examples was charged into a weather fastness tester (Super Xenon Weather Meter SX75 manufactured by Suga Test Instruments Co., Ltd.), the sheet surface was irradiated with light under the light irradiation conditions of the weather fastness tester were set to an illuminance of 180 W/m$^2$ and a black panel temperature 63° C. with humidification and rainfall, and then the hue change of the sheet surface irradiated with light for 50 hours was evaluated with the color difference value ΔE obtained using a color difference meter (CR-400 manufactured by Konica Minolta Inc.). From the ΔE value, the weather fastness was evaluated according to the following standards.

(Evaluation Standards)

A: The ΔE value before and after irradiation is less than 1.0.

B: The ΔE value before and after irradiation is 1.0 or more and less than 2.5.

C: The ΔE value before and after irradiation is 2.5 or more and less than 5.0.

D: The ΔE value before and after irradiation is 5.0 or more.

The above results are shown in Table 3 (Tables 3-1 to 3-6).

TABLE 3-1

| | | | Example 1 | Example 2 | Example 3 | Example 4 | Example 5 | Example 6 | Example 7 | Example 8 | Example 9 | Example 10 |
|---|---|---|---|---|---|---|---|---|---|---|---|---|
| Magnetic powder | | Kind | R-1 | R-2 | R-3 | R-4 | R-5 | R-6 | R-7 | R-8 | R-9 | R-10 |
| | Surface treatment agent | Kind | SP-3 | SP-3 | SP-3 | SP-3 | SP-3 | SP-3 | SP-3 | SK-1 | SK-2 | SK-3 |
| | | Using amount [part by mass] | 1.0 | 1.0 | 1.0 | 1.0 | 1.0 | 1.0 | 1.0 | 1.0 | 1.0 | 1.0 |
| | Content [% by mass] | | 60 | 60 | 60 | 60 | 60 | 60 | 60 | 60 | 60 | 60 |
| Binder | Kind | | B-1 | B-1 | B-1 | B-1 | B-1 | B-1 | B-1 | B-1 | B-1 | B-1 |
| | Content [% by mass] | | 40 | 40 | 40 | 40 | 40 | 40 | 40 | 40 | 40 | 40 |
| Radio wave absorption performance | | | A | A | A | A | A | A | A | B | B | B |
| Vibration damping property | | | A | A | A | A | A | A | A | A | A | A |
| Weather fastness | | | A | A | A | A | A | A | A | B | A | B |

TABLE 3-2

| | | | Example 11 | Example 12 | Example 13 | Example 14 | Example 15 | Example 16 | Example 17 | Example 18 | Example 19 | Example 20 |
|---|---|---|---|---|---|---|---|---|---|---|---|---|
| Magnetic powder | | Kind | R-11 | R-12 | R-13 | R-14 | R-15 | R-16 | R-17 | R-18 | R-19 | R-20 |
| | Surface treatment agent | Kind | SV-1 | SV-2 | SV-3 | SV-4 | SV-5 | SP-1 | SP-2 | SP-4 | SI-1 | SI-2 |
| | | Using amount [part by mass] | 1.0 | 1.0 | 1.0 | 1.0 | 1.0 | 1.0 | 1.0 | 1.0 | 1.0 | 1.0 |
| | Content [% by mass] | | 60 | 60 | 60 | 60 | 60 | 60 | 60 | 60 | 60 | 60 |
| Binder | Kind | | B-1 | B-1 | B-1 | B-1 | B-1 | B-1 | B-1 | B-1 | B-1 | B-1 |
| | Content [% by mass] | | 40 | 40 | 40 | 40 | 40 | 40 | 40 | 40 | 40 | 40 |
| Radio wave absorption performance | | | B | B | B | B | B | A | A | A | C | B |
| Vibration damping property | | | A | A | A | A | A | A | A | A | C | C |
| Weather fastness | | | B | A | B | B | B | A | A | A | B | B |

TABLE 3-3

| | | | Example 21 | Example 22 | Example 23 | Example 24 | Example 25 | Example 26 | Example 27 | Example 28 | Example 29 | Example 30 |
|---|---|---|---|---|---|---|---|---|---|---|---|---|
| Magnetic powder | Kind | | R-21 | R-22 | R-23 | R-24 | R-25 | R-26 | R-27 | R-5 | R-5 | R-5 |
| | Surface treatment agent | Kind | SI-3 | SP-3 | SP-3 | SP-3 | SP-3 | SP-3 | SP-3 | SP-3 | SP-3 | SP-3 |
| | | Using amount [part by mass] | 1.0 | 0.2 | 0.5 | 1.5 | 2.0 | 5.0 | 10.0 | 1.0 | 1.0 | 1.0 |
| | Content [% by mass] | | 60 | 60 | 60 | 60 | 60 | 60 | 60 | 60 | 60 | 60 |
| Binder | Kind | | B-1 | B-1 | B-1 | B-1 | B-1 | B-1 | B-1 | B-2 | B-3 | B-4 |
| | Content [% by mass] | | 40 | 40 | 40 | 40 | 40 | 40 | 40 | 40 | 40 | 40 |
| Radio wave absorption performance | | | B | C | A | A | A | B | B | A | A | A |
| Vibration damping property | | | C | B | A | A | B | B | C | A | A | A |
| Weather fastness | | | B | C | A | A | A | A | A | A | A | A |

TABLE 3-4

| | | | Example 31 | Example 32 | Example 33 | Example 34 | Example 35 | Example 36 |
|---|---|---|---|---|---|---|---|---|
| Magnetic powder | Kind | | R-5 | R-5 | R-5 | R-5 | R-5 | R-5 |
| | Surface treatment agent | Kind | SP-3 | SP-3 | SP-3 | SP-3 | SP-3 | SP-3 |
| | | Using amount [part by mass] | 1.0 | 1.0 | 1.0 | 1.0 | 1.0 | 1.0 |
| | Content [% by mass] | | 60 | 60 | 60 | 60 | 60 | 60 |
| Binder | Kind | | B-5 | B-6 | B-7 | B-8 | B-9 | B-10 |
| | Content [% by mass] | | 40 | 40 | 40 | 40 | 40 | 40 |
| Radio wave absorption performance | | | A | A | A | B | B | B |
| Vibration damping property | | | A | A | A | A | A | A |
| Weather fastness | | | A | A | A | B | B | C |

TABLE 3-5

| | | | Example 37 | Example 38 | Example 39 | Example 40 |
|---|---|---|---|---|---|---|
| Magnetic powder | Kind | | R-5 | R-5 | R-5 | R-5 |
| | Surface treatment agent | Kind | SP-3 | SP-3 | SP-3 | SP-3 |
| | | Using amount [part by mass] | 1.0 | 1.0 | 1.0 | 1.0 |
| | Content [% by mass] | | 20 | 40 | 70 | 80 |
| Binder | Kind | | B-1 | B-1 | B-1 | B-1 |
| | Content [% by mass] | | 80 | 60 | 30 | 20 |
| Radio wave absorption performance | | | C | B | A | A |
| Vibration damping property | | | A | A | A | A |
| Weather fastness | | | A | A | A | B |

The binders in Table 3 are the following olefin-based resins.

[Binder]

B-1: A ethylene-vinyl acetate-maleic acid anhydride resin (OREVAC T 9314 manufactured by Arkema S.A.)

B-2: A maleic acid anhydride graft-polyethylene resin (OREVAC G OE808 manufactured by Arkema S.A.)

B-3: An ethylene-acrylic acid ester-maleic acid anhydride resin (BONDINE 5500 manufactured by Arkema S.A.)

B-4: A cycloolefin resin (manufactured by ZEON CORPORATION, trade name: "ZEONOR 1020R")

B-5: Polymethylpentene (TPX RT18 manufactured by Mitsui Chemicals, Inc.)

B-6: An ethylene-norbornene resin (Topas 8007S-04 manufactured by Polyplastics Co., Ltd.)

B-7: A dicyclopentadiene resin (METTON T02 manufactured by RIMTEC Corporation)

B-8: An ethylene-vinyl acetate resin (EVA; Ultrathene 537 manufactured by Tosoh Corporation)

TABLE 3-6

| | | | Comparative Example 1 | Comparative Example 2 | Comparative Example 3 | Comparative Example 4 | Comparative Example 5 |
|---|---|---|---|---|---|---|---|
| Magnetic powder | Kind | | — | A-5 | A-8 | R-28 | R-29 |
| | Surface treatment agent | Kind | — | — | — | SP-3 | ST-1 |
| | | Using amount [part by mass] | | | | 1 | 1.0 |
| | Content [% by mass] | | | 60 | 60 | 60 | 60 |
| Binder | Kind | | B-1 | B-1 | B-1 | B-1 | B-1 |
| | Content [% by mass] | | 100 | 40 | 40 | 40 | 40 |
| Radio wave absorption performance | | | D | C | D | D | C |
| Vibration damping property | | | C | D | D | C | D |
| Weather fastness | | | D | D | D | D | D |

B-9: A high-density polyethylene resin (HDPE; HI-ZEX 232J manufactured by Prime Polymer Co., Ltd.)

B-10: polypropylene (PP; NOVATEC MA3 manufactured by Japan Polypropylene Corporation)

The radio wave absorbers of Examples 1 to 40 contain a powder of a substitution-type hexagonal ferrite subjected to surface treatment with a silicon-based compound, as a magnetic powder, and contain an olefin-based resin as a binder.

On the other hand, the radio wave absorber of Comparative Example 2 contains a powder of a substitution-type hexagonal ferrite subjected to no surface treatment and an olefin-based resin, the radio wave absorber of Comparative Example 3 contains a powder of an unsubstitution-type hexagonal ferrite subjected to no surface treatment and an olefin-based resin, and the radio wave absorber of Comparative Example 4 contains a powder of an unsubstitution-type hexagonal ferrite subjected to surface treatment with a silicon-based compound and an olefin-based resin. The radio wave absorber of Comparative Example 5 contains a powder of a substitution-type hexagonal ferrite subjected to surface treatment with a titanium-based compound, and an olefin-based resin.

From the comparison between Examples 1 to 40 in Table 3 and Comparative Examples 2 to 5, it can be confirmed in a case where a substitution-type hexagonal ferrite powder subjected to surface treatment with a silicon-based compound and an olefin-based resin are combined as a magnetic powder and a binder, it is possible to obtain a radio wave absorber excellent radio wave absorption performance, weather fastness, and vibration damping property.

One embodiment of the present invention is useful in the technical field of carrying out various automatic driving controls such as automatic driving control of an automobile.

What is claimed is:

1. A radio wave absorber,
which comprises a radio wave absorber layer comprising:
a magnetic powder; and
a binder,
wherein the magnetic powder is a powder of a substitution-type hexagonal ferrite subjected to surface treatment with a surface treatment agent,
the surface treatment agent is a silicon-based compound, and
the binder is an olefin-based resin, said olefin-based resin being one or more resins selected from the group consisting of polymethylpentene, a cycloolefin resin, and an olefin-based resin containing a maleic acid anhydride unit, and
which comprises the magnetic powder in an amount of 50% by mass or more and 75% by mass or less, with respect to the total mass (100% by mass) of the magnetic powder and the resin, and
which does not comprise a metal layer, the metal layer being a layer containing a metal and substantially reflecting radio waves, wherein "substantially reflecting radio waves" means reflecting 90% or more of incident radio waves in a case where the radio waves are incident on the radio wave absorber layer in a state where the metal layer is laminated on the back surface of the radio wave absorber layer.

2. The radio wave absorber according to claim 1, wherein the substitution-type hexagonal ferrite has a constitution represented by General Formula 1, $$AFe_{(12-x)}Al_xO_{19}$$ General Formula 1 in General Formula 1, A represents one or more kinds of atoms selected from the group consisting of Sr, Ba, Ca, and Pb, and x satisfies $1.50 \leq x \leq 8.00$.

3. The radio wave absorber according to claim 1, wherein the substitution-type hexagonal ferrite is a substitution-type hexagonal strontium ferrite.

4. The radio wave absorber according to claim 1, wherein the surface treatment agent is a silicon-based compound represented by General Formula 2, $$2{:}(X\text{-}L)_m\text{—Si—}Z_{4-m}$$ General Formula 2 in General Formula 2,

X represents a hydrogen atom, an alkyl group, an alkenyl group, an aryl group, an alicyclic group, a heterocyclic group, a hydroxy group, an acrylamide group, a sulfanyl group, an isocyanate group, a thiocyanate group, a ureido group, a cyano group, an acid anhydride group, an azide group, a carboxy group, an acyl group, a thiocarbamoyl group, a phosphate group, a phosphanyl group, a sulfonic acid group, or a sulfamoyl group, L represents one divalent group or one bond, selected from the group consisting of a single bond, an alkylene group, an alkenylene group, an alkynylene group, an arylene group, —O—, —S—, —NR$^a$—, an ester bond, a thioester bond, an amide bond, a thioamide bond, and a sulfonyl group, or a divalent group or a bond, obtained by combining two or more of these, R$^a$ represents a hydrogen atom or a substituent, Z represents a hydroxy group, an alkoxy group, or an alkyl group, and m is an integer in a range of 1 to 3.

5. The radio wave absorber according to claim 4, wherein in General Formula 2, m is 1, and X represents an alkenyl group or a heterocyclic group, or m is 2 or 3, and a plurality of X's included in General Formula 2 each independently represent an alkenyl group or a heterocyclic group.

6. The radio wave absorber according to claim 4, wherein in General Formula 2, m is 1, and X represents an acyl group, an acrylamide group, or a heterocyclic group, or m is 2 or 3, and a plurality of X's included in General Formula 2 each independently represent an acyl group, an acrylamide group, or a heterocyclic group, where the acyl group is a (meth)acryloyl group, and the heterocyclic group is an epoxy group.

7. The radio wave absorber according to claim 4, wherein in General Formula 2, X represents a heterocyclic group, and the heterocyclic group is an epoxy group.

8. The radio wave absorber according to claim 7, wherein in General Formula 2, L includes an alkylene group having 4 to 12 carbon atoms.

* * * * *